United States Patent
Adams

(10) Patent No.: US 10,825,586 B2
(45) Date of Patent: Nov. 3, 2020

(54) METHOD AND SYSTEM FOR FORMING A MULTILAYER COMPOSITE STRUCTURE

(71) Applicant: Ultra Conductive Copper Company, Inc., Lexington, MA (US)

(72) Inventor: Horst Jakob Adams, Houston, TX (US)

(73) Assignee: Ultra Conductive Copper Company, Inc., Lexington, MA (US)

( * ) Notice: Subject to any disclaimer, the term of this patent is extended or adjusted under 35 U.S.C. 154(b) by 401 days.

(21) Appl. No.: 15/691,093

(22) Filed: Aug. 30, 2017

(65) Prior Publication Data

US 2019/0066879 A1   Feb. 28, 2019

(51) Int. Cl.
| | |
|---|---|
| *H01B 13/00* | (2006.01) |
| *H01B 1/02* | (2006.01) |
| *H01B 5/04* | (2006.01) |
| *C23C 16/26* | (2006.01) |
| *C23C 16/54* | (2006.01) |
| *C22F 1/08* | (2006.01) |
| *C23C 16/56* | (2006.01) |
| *B21B 1/38* | (2006.01) |

(Continued)

(52) U.S. Cl.
CPC .......... *H01B 13/0006* (2013.01); *C22F 1/08* (2013.01); *C23C 16/26* (2013.01); *C23C 16/545* (2013.01); *C23C 16/56* (2013.01); *H01B 1/026* (2013.01); *H01B 5/04* (2013.01); *H01B 13/0003* (2013.01); *H01B 13/0016* (2013.01); *H01B 13/0033* (2013.01); *B21B 1/38* (2013.01); *B21B 2001/225* (2013.01); *B21B 2001/383* (2013.01); *C21D 8/0278* (2013.01)

(58) Field of Classification Search
CPC ........ H01B 5/02; H01B 5/04; H01B 13/0006; H01B 13/0016; C22F 1/08; C23C 16/26; C23C 16/545; B21B 1/166
See application file for complete search history.

(56) References Cited

U.S. PATENT DOCUMENTS

| | | | |
|---|---|---|---|
| 2011/0226509 A1 | 9/2011 | Kim et al. | |
| 2014/0044885 A1* | 2/2014 | Boyd | H01J 37/32522 |
| | | | 427/534 |

(Continued)

FOREIGN PATENT DOCUMENTS

| | | |
|---|---|---|
| CN | 105845942 A | 8/2016 |
| CN | 107403656 A | 11/2017 |

(Continued)

OTHER PUBLICATIONS

Che et al., "Retained Carrier-Mobility and Enhanced Plasmonic-Photovoltaics of Graphene via ring-centered $\eta^6$ Functionalization and Nanointertacing," *Nano Letters*, 17(7): 4381-4389 (Jun. 6, 2017).

(Continued)

*Primary Examiner* — Peter Dungba Vo
*Assistant Examiner* — Jeffrey T Carley
(74) *Attorney, Agent, or Firm* — Leydig, Voit & Mayer, Ltd.

(57) ABSTRACT

A method for forming a multilayer composite structure comprises providing a first sheet comprising a copper-comprising layer sandwiched by first and second graphene layers, wrapping the first sheet to form a first rod, and compacting the first rod to form a first multilayer composite structure.

16 Claims, 24 Drawing Sheets

(51) Int. Cl.
*C21D 8/02* (2006.01)
*B21B 1/22* (2006.01)

(56) References Cited

U.S. PATENT DOCUMENTS

| | | | |
|---|---|---|---|
| 2014/0053973 A1* | 2/2014 | Shin | B32B 15/08 |
| | | | 156/241 |
| 2014/0170483 A1* | 6/2014 | Zhang | H01M 4/0428 |
| | | | 429/211 |
| 2015/0194241 A1 | 7/2015 | Tanielian | |
| 2016/0168693 A1* | 6/2016 | Schmidt | H01B 1/04 |
| | | | 427/117 |
| 2017/0145561 A1* | 5/2017 | Farquhar | C23C 16/26 |
| 2017/0338312 A1* | 11/2017 | Treossi | H01L 21/6835 |

FOREIGN PATENT DOCUMENTS

| | | | | |
|---|---|---|---|---|
| EP | 2814040 A1 * | 12/2014 | | C23C 16/06 |
| EP | 3252778 A1 | 12/2017 | | |
| WO | WO-2014116258 A1 * | 7/2014 | | H01L 23/3735 |
| WO | WO-2018032055 A1 * | 2/2018 | | B32B 9/00 |

OTHER PUBLICATIONS

Polsen et al., "High-speed roll-to-roll manufacturing of graphene using a concentric tube CVD reactor," *Scientific reports*, 5: 1-12, article No. 10257 (May 21, 2015).

\* cited by examiner providing a copper foil having a first surface side and a second surface side opposite the first surface side, wherein the copper foil has a thickness of less than 25 μm; and — S10 depositing a first graphene layer on the first surface side of the copper foil and a second graphene layer on the second surface side of the copper foil. — S12

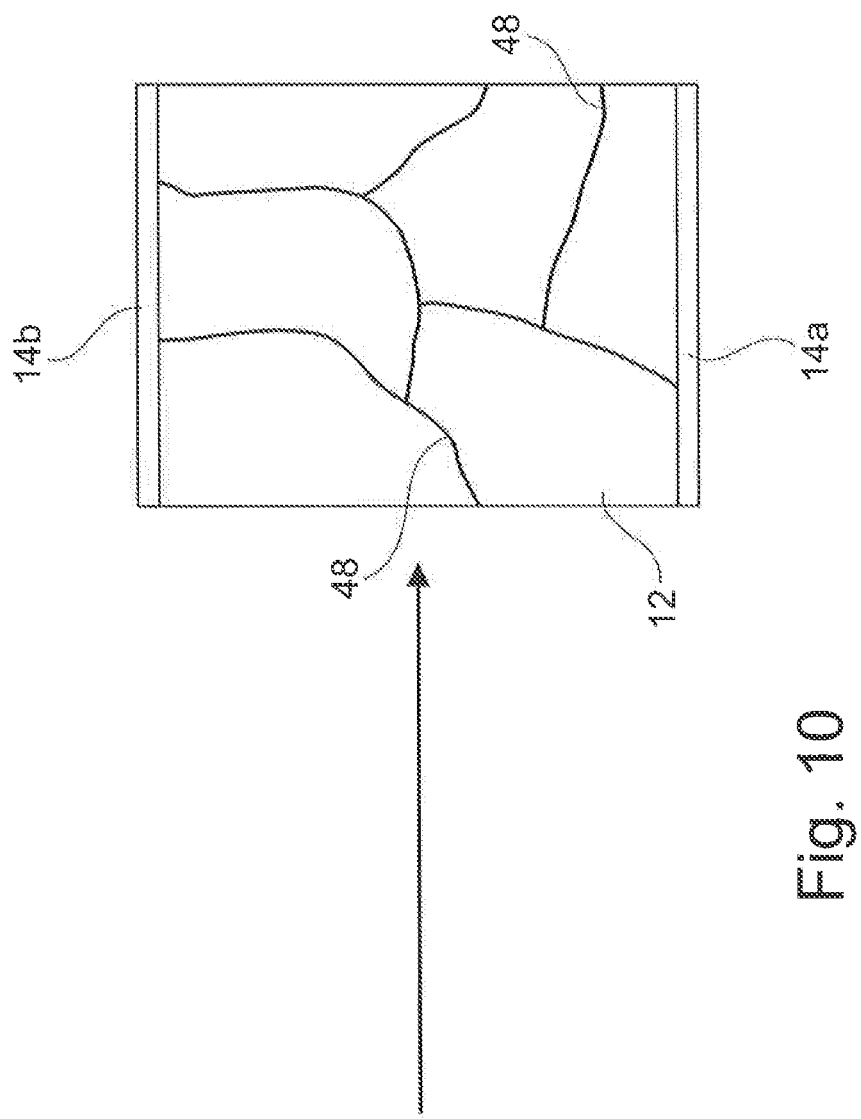
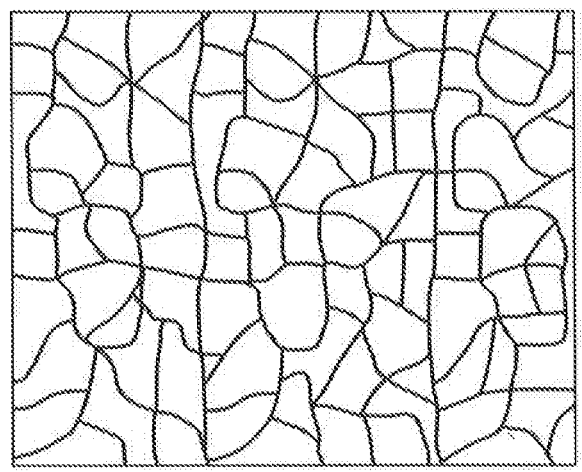
Fig. 10

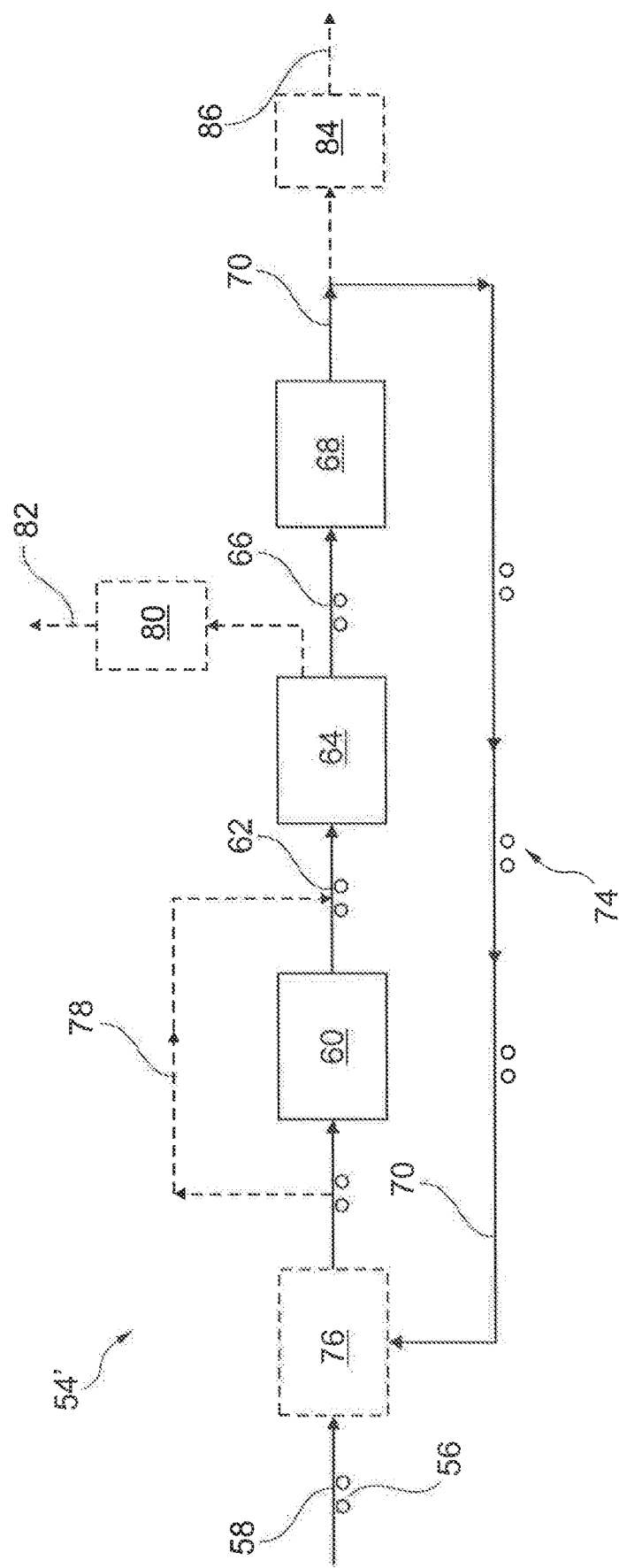

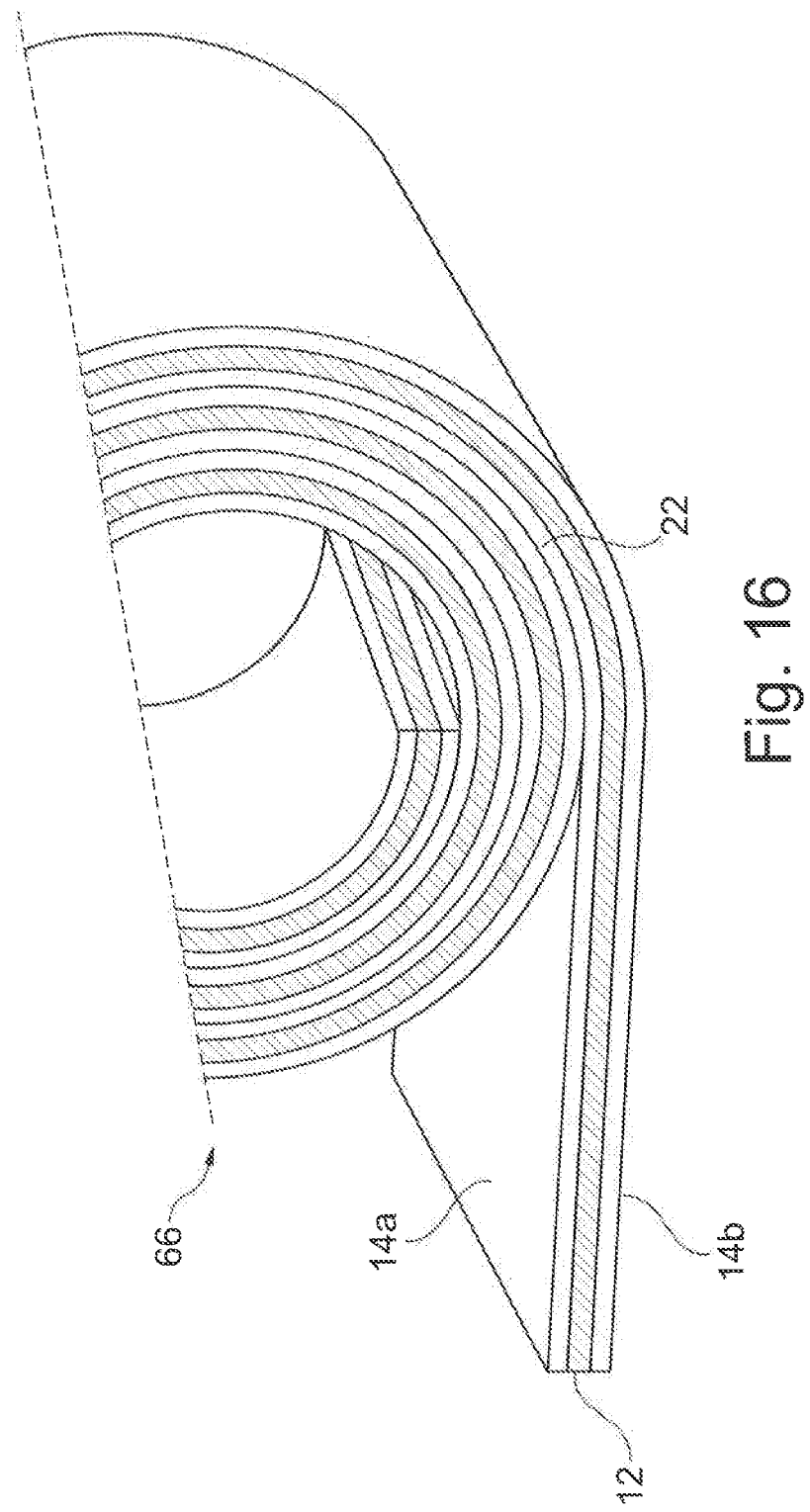

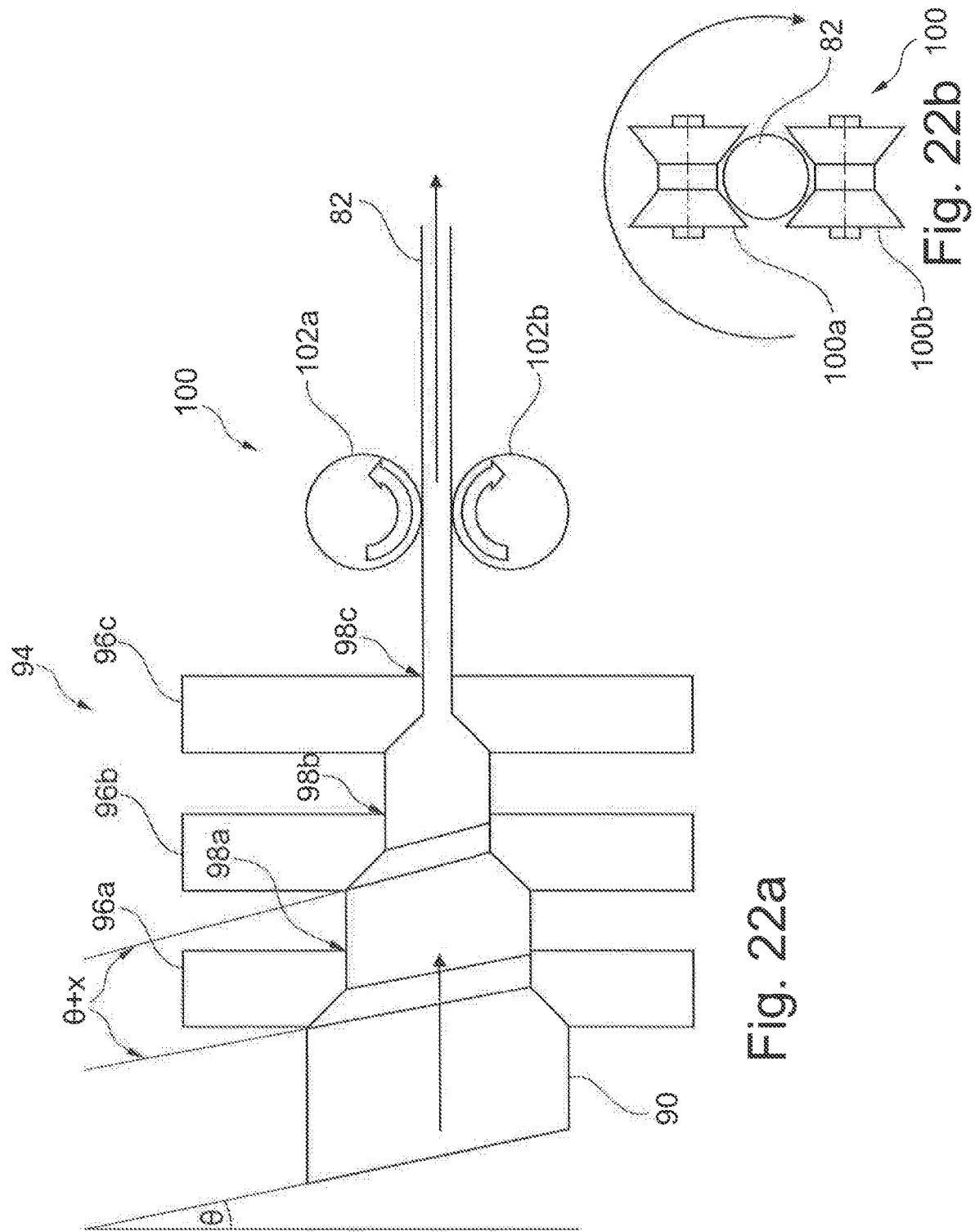

METHOD AND SYSTEM FOR FORMING A MULTILAYER COMPOSITE STRUCTURE

TECHNICAL FIELD

The disclosure relates to forming a multilayer composite structure and corresponding manufacturing equipment, in particular for manufacturing copper with enhanced electrical conductivity, thermal conductivity, and/or mechanical strength.

BACKGROUND

Copper is known as the most cost-effective and reliable electrically conductive material, and second only to silver in its ability to conduct electricity. Increasing demand for electrical power and the need to generate and transmit electricity more efficiently, and more environmentally friendly, has spurred the search for conductors with an increased electric conductivity.

Intensive investigations have been made for improving the electrical performance of copper nanowires compared to copper thin films, such as described in T. Gao et al., Journal of Applied Physics 2013, 114, 063107. However, the effective conductivity of these nanowires is usually not significantly larger than its ideal bulk value, and may be highly dependent on technological constraints.

BRIEF SUMMARY OF THE DISCLOSURE

In view of the known prior art, what is needed is an improved method for forming a multilayer composite structure that allows to efficiently mass-produce multilayer composite structures with a high volume percentage of graphene.

This objective is achieved with a method and system for forming a multilayer composite structure according to independent claims 1 and 16, respectively. The dependent claims relate to preferred embodiments.

A method for forming a multilayer composite structure comprises providing a first sheet comprising a copper-comprising layer sandwiched by first and second graphene layers, wrapping the first sheet to form a first rod, and compacting the first rod to form a first multilayer composite structure.

Wrapping and compacting the sheet provides for an efficient technique of forming a multilayer composite structure comprising multiple copper layers each sandwiched by graphene layers. Such a multilayer composite structure has enhanced electric conductivity, thermal conductivity and mechanical strength in the in-plane direction. Moreover, the degree of wrapping and/or compacting allows to carefully adjust and tailor the number of respective layers in the multilayer composite structure, and thereby the dimensions, electrical, mechanical and thermal properties of the resulting multilayer composite structure.

In addition, wrapping of the first sheet having first and second graphene layers on its opposing outer side surfaces yields a rod in which the first and the second graphene layers are in immediate/direct mechanical and electrical contact. When compacting such a rod, graphene bi-layer structures are formed, which are particularly effective to enhance the electric conductivity of the composite structure, both in an in-plane direction of the multilayer composite structure and perpendicular to the in-plane direction.

A copper-comprising layer, in the sense of the present disclosure, may be any layer comprising copper. In particular, the copper-comprising layer may comprise copper at least partly in a (111) crystallographic orientation.

In an example, the copper-comprising layer comprises pure copper, or comprises at least 90% copper by weight.

In other examples, the copper-comprising layer may comprise at least 80% copper, or at least 60% copper by weight.

In some examples, the copper-comprising layer may comprise copper in addition to material different from copper.

In some examples, the copper-comprising layer may itself be a composite structure, such as a multilayer composite structure comprising both graphene and copper, in particular in a multi-step process circle in which the steps of the method are iteratively repeated.

In an example, the weight percentage of copper in the composite structure may be at most 50%, and in particular at most 30%.

In an example, the copper-comprising layer has a thickness of no larger than 500 µm or no larger than 100 µm, and in particular no larger than 50 µm.

The copper-comprising layer may have a thickness of no larger than 25 µm, and in particular no larger than 10 µm.

A copper-comprising layer with a low thickness enhances the relative volume percentage of graphene in the resulting multilayer composite structure, which may result in a multilayer composite structure of enhanced electric conductivity, thermal conductivity, and mechanical strength.

Moreover, a reduction of the thickness of the copper layer reduces inelastic electron scattering within the copper-comprising layer, which may further foster the electric conductivity.

In an example, the copper-comprising layer has a thickness of no larger than 5 µm, and in particular no larger than 2 µm.

In an example, the copper-comprising layer has a grain size of at least 1 µm, and in particular at least 5 µm.

In particular, the copper-comprising layer may have a grain size of at least 10 µm, and in particular at least 50 µm.

Grain size, in the sense of the present disclosure, may refer to an average distance between grain boundaries.

A copper-comprising layer with increased grain size reduces the inelastic scattering within the copper layer, and may thereby further increase the electric conductivity.

In an example, the compacting may comprise forming a first elongated multilayer composite band.

In an example, the compacting may comprise rolling, in particular hot rolling.

Rolling allows to effectively and efficiently compact the first rod to form a first multilayer composite structure.

Hot rolling, in particular, may lead to a grain coarsening within the copper-comprising layer, so that the resulting multilayer composite structure comprises copper with increased grain size, reduced inelastic electron scattering and hence a higher electric conductivity.

In particular, the compacting comprises hot rolling at a temperature of at least 250° C., in particular at least 450° C.

In an example, the compacting comprises hot rolling at a temperature of at most 650° C., in particular at most 550° C.

This temperature range is higher than the copper recrystallization temperature, and allows for efficient grain coarsening. At the same time, the temperature range is low enough to reduce thermal stress of the copper-comprising layer, prevent reconfiguration of the crystallographic structure and reduce the risk of nano-cracks forming on the copper surface.

Graphene, in the sense of the present disclosure, may refer to a carbon-comprising layer in which the carbon atoms are, as in graphite, hexagonally arranged and generally sp² hybridized. The resulting structure may be a honeycomb-shaped hexagonal pattern of fused six-member carbon rings.

The term graphene may refer to a configuration with a carbon monolayer, but in practice a small number of layers may also be denoted as graphene.

In a narrow sense, the graphene comprises only carbon. In other examples, the graphene may be doped to comprise atoms and/or molecules different from carbon atoms.

In an example, the first graphene layer and/or the second graphene layer each have a thickness of no larger than 5 nm, and in particular no larger than 2 nm.

In an example, the first graphene layer and/or the second graphene layer may comprise at most 4 graphene monolayers, and in particular, at most 3 graphene monolayers.

In particular, the first graphene layer and/or the second graphene layer may be graphene monolayers or graphene bi-layers.

In an example, the first graphene layer and the second graphene layer are formed on opposite outer side surfaces of the first sheet.

In an example, providing the first sheet comprises depositing the first graphene layer on a first surface side of the copper-comprising layer, and depositing the second graphene layer on a second surface side of the copper-comprising layer, the second surface side opposite from the first surface side.

Any coating technique may be employed to deposit the first and second graphene layers.

In particular, depositing may comprise chemical vapor deposition.

In an example, depositing the first graphene layer and/or depositing the second graphene layer comprises cold plasma enhanced depositing, in particular cold plasma enhanced chemical vapor deposition.

Cold plasma enhanced depositing allows to deposit the first graphene layer and the second graphene layer at lower temperatures than in conventional graphene growth, which may lead to reduced thermal stress of the copper surface and may prevent a reconfiguration of the copper surface away from the beneficial Cu (111) orientation. At the same time, the surface temperatures achievable in cold plasma enhanced depositing are still high enough to foster a grain coarsening of the underlying copper-comprising layer, so to reduce the inelastic scattering on the grain boundaries.

In an example, the cold plasma enhanced depositing involves plasma at a temperature of at most 800° C., in particular at most 700° C.

The cold plasma enhanced depositing may involve plasma at a temperature of at least 450° C., in particular at least 600° C.

In some examples, the first graphene layer and the second graphene layer may be deposited subsequently.

In other examples, the first graphene layer and the second graphene layer may be deposited simultaneously.

In an example, the first graphene layer and/or the second graphene layer are doped with metal atoms, in particular metal atoms ring-centered on graphene rings.

The metal atoms may serve as anchoring points for firmly connecting the graphene layers to the copper matrix.

In an example, the metal atoms comprise silver atoms.

In an example, the method further comprises etching a first surface side of the first multilayer composite structure, and/or etching a second surface side of the first multilayer composite structure, wherein the second surface side is opposite from the first surface side.

For instance, the first surface side and/or the second surface side may be etched using a commercially available etchant, such as copper etchant type CE-100 for a period of 1 to 10 minutes.

In particular, said first surface side and/or said second surface side may be etched to provide a pristine surface following the compacting. This may be particularly useful in a configuration in which additional layers, such as graphene layers, may be subsequently formed on the first surface side and/or the second surface side of the multilayer composite structure, such as in an iterative process of the method described above.

In an example, the method further comprises forming a second sheet from the first sheet, comprising depositing a third graphene layer on a first surface side of the first multilayer composite structure; and depositing a fourth graphene layer on a second surface side of the first multilayer composite structure, wherein the second surface side is opposite from the first surface side.

The second sheet may hence comprise the first multilayer composite structure as described above, sandwiched by the third graphene layer and the fourth graphene layer.

Depositing the third and fourth graphene layers may comprise any coating techniques.

In particular, the third graphene layer and/or the fourth graphene layer may be formed using the techniques described above in the context of the first graphene layer and/or the second graphene layer.

In particular, depositing the third graphene layer and/or depositing the fourth graphene layer may comprise chemical vapor deposition.

In an example, depositing the third graphene layer and/or depositing the fourth graphene layer may comprise cold plasma enhanced depositing, in particular cold plasma enhanced chemical vapor deposition.

The third graphene layer and the fourth graphene layer may be deposited subsequently.

In other examples, the third graphene layer and the fourth graphene layer may be deposited simultaneously.

In an example, the third graphene layer and/or the fourth graphene layer may each have a thickness of no larger than 5 nm, and in particular no larger than 2 nm.

In an example, the third graphene layer and/or the fourth graphene layer may comprise at most 4 graphene monolayers, and in particular at most 3 graphene monolayers.

In particular, the third graphene layer and/or the fourth graphene layer may be monolayers or bi-layers.

In an example, the method may comprise electrically charging the copper-comprising layer.

An electrically charged copper-comprising layer may assist in depositing the graphene layers by means of electrostatic attraction forces.

In particular, the method may further comprise electrically charging a precursor gas, in particular with a charge opposite from a charge of the copper-comprising layer.

In an example, the method may comprise electrically charging the multilayer composite structure.

The method may further comprise electrically charging a precursor gas, in particular with a charge opposite from a charge of the multilayer composite structure.

The method may comprise doping the third graphene layer and/or doping the fourth graphene layer with metal atoms, in particular metal atoms ring-centered on graphene rings.

In an example, the metal atoms may comprise silver atoms.

In an example, the method further comprises repeating for the second sheet the steps described above with reference to the first sheet. Hence, the method according to the disclosure may be iterated to comprise subsequent steps of coating, wrapping and compacting in a process circle to form a multilayer composite structure comprising a plurality of copper-comprising layers and graphene layers. In particular, the process circle allows to enhance and tailor the volume percentage of graphene in the resulting multilayer composite structure.

In particular, the method may comprise a step of wrapping the second sheet to form a second rod, and compacting the second rod to form a second multilayer composite structure.

In particular, the compacting may comprise forming a second elongated multilayer composite band.

In an example, the compacting comprises rolling, in particular hot rolling.

The compacting may comprise hot rolling at a temperature of at least 250° C., in particular at least 450° C.

In an example, the compacting may comprise hot rolling at a temperature of at most 650° C., in particular at most 550° C.

The process steps of the method as described above may be iterated and repeated any number of times.

In an example, the method comprises wrapping the second multilayer structure to form a third rod.

In some examples, this wrapping step may be a step terminating the process circle as described above. The third rod may be a rod having a multilayer composite structure, and may be used as an electrical conductor with enhanced electric conductivity, thermal conductivity, and/or mechanical strength.

In an example, the second multilayer structure may be wrapped without a preceding depositing of graphene on the second multilayer structure.

Omission of the depositing step in the final round of iterations may provide a graphene-free surface with optimum conditions for connecting the resulting wire to sockets, plugs, etc.

In an example, the method comprises wire-drawing the third rod into a wire, in particular a wire having an elliptic cross section or a circular cross section.

Wire drawing may be efficient to form a wire of tailored length and dimensions from the rod.

In an alternative, the method further comprises compacting the third rod to form a third multilayer composite structure.

In particular, the compacting may comprise forming a third elongated multilayer composite band.

The compacting may comprise rolling, in particular hot rolling.

In an example, the compacting may comprise hot rolling at a temperature of at least 250° C., in particular at least 450° C.

The compacting may comprise hot rolling at a temperature of at most 650° C., in particular at most 550° C.

In some examples, the third multilayer composite structure may be sliced to form a plurality of elongated slices.

These techniques allow to form a multilayer electric conductor with a rectangular or square cross-section.

The disclosure also relates to a system for forming a multilayer composite structure, comprising a transport unit to transport a sheet having a first surface side and a second surface side opposite the first surface side; a deposition unit to deposit a first graphene layer on the first surface side of the sheet and a second graphene layer on the second surface side of the sheet to form a coated sheet; a wrapping unit downstream of the deposition unit to wrap the coated sheet into a rod; a compacting unit downstream of the wrapping unit to compact the rod into a compacted sheet; and a back-feeding unit downstream of the wrapping unit to back-feed the compacted sheet to the deposition unit.

A downstream direction, in the sense of the disclosure, may refer to a direction of travel of the processed sheet from the deposition unit to the wrapping unit to the compacting unit, and by means of the back-feeding unit back to the deposition unit.

The transport unit may transport the coated sheet from the deposition unit to the wrapping unit and/or may transport the rod from the wrapping unit to the compacting unit.

The transport unit may also comprise the back-feeding unit.

In some examples, the back-feeding unit allows for the sheet to be circled a pre-defined number of times through the depositing unit, wrapping unit, and compacting unit in succession.

In some examples, the transport unit, the deposition unit, the wrapping unit, the compacting unit, and/or the back-feeding unit may be separate units. In other examples, any or all of the transport unit, the deposition unit, the wrapping unit, the compacting unit, and/or the back-feeding unit may be integrated into a common unit.

In an example, the deposition unit comprises at least a cold plasma unit, in particular a cold plasma tube.

The deposition unit may further comprise a supply unit to supply and direct a precursor gas towards the first surface side and the second surface side.

In an example, the precursor gas may comprise carbon, and in particular may comprise methane and/or butane and/or propane and/or CO and/or acetylene.

In particular, the supply unit may be configured to supply the precursor gas towards the first surface side and the second surface side through a cold plasma generated by the cold plasma unit.

The transport unit may transport the sheet through the deposition unit and/or through the wrapping unit and/or through the compacting unit.

In an example, the transport unit comprises a first roller unit to transport the sheet and a second roller unit to transport the sheet downstream of the first roller unit, wherein the second roller unit rotates in a direction opposite from the first roller unit.

The counter-rotating first and second rollers may reverse a surface orientation of the sheet. In particular, this may allow the sheet to be deposited first on a first surface side, the sheet then be reversed and deposited on a second surface side opposite from the first surface side.

Hence, in an example, the deposition unit is configured to deposit the first graphene layer on the first surface side of the sheet while the sheet is transported on the first roller unit, and the deposition unit may be configured to deposit the second graphene layer on the second surface side of the sheet while the sheet is transported on the second roller unit.

The same sequence of steps as described above for the sheet can be performed with the compacted sheet, wherein the compacted sheet substitutes the sheet in the system as described above.

In particular, the deposition unit may be configured to deposit a third graphene layer on a first surface side of the compacted sheet and a second graphene layer on a second surface side of the compacted sheet to form a coated compacted sheet.

The transport unit may comprise a first roller unit to transport the compacted sheet and a second roller unit to transport the compacted sheet downstream of the first roller unit, wherein the second roller unit rotates in a direction opposite from the first roller unit.

The deposition unit may be configured to deposit a third graphene layer on a first surface side of the compacted sheet while the compacted sheet is transported on the first roller unit, and the deposition unit may be configured to deposit a fourth graphene layer on a second surface side of the compacted sheet while the compacted sheet is transported on the second roller unit.

The wrapping unit may be configured to wrap the coated compacted sheet into a second rod.

The compacting unit may be configured to compact the second rod into a second compacted sheet.

The back-feeding unit may be adapted to back-feed the second compacted sheet back to the deposition unit for another cycle round.

In an example, the transport unit transports the sheet and/or the compacted sheet through the deposition unit at least partly in a vertical direction.

In an example, the transport unit transports the sheet and/or the compacted sheet along a direction that forms an angle of at most 20°, and in particular at most 10°, with a vertical direction.

The vertical direction may denote a direction of a gravitational field in which the system is placed.

In an example, the system further comprises a charging unit to electrically charge the sheet and/or the compacted sheet.

The charging unit may be further configured to electrically charge the precursor gas, in particular with a charge opposite from a charge of the sheet or compacted sheet, respectively.

In an example, the system further comprises a doping unit to dope at least one of the first, second, third, or fourth graphene layers with metal atoms, in particular metal atoms ring-centered on graphene rings.

The compacting unit may comprise a rolling unit, in particular a hot rolling unit.

The rolling unit may be configured to hot-roll the rod at a temperature of at least 250° C., in particular at least 450° C.

The rolling unit may be further configured to hot-roll the rod at a temperature of at most 650° C., in particular at most 550° C.

In an example, the system further comprises a bypass unit to bypass the sheet and/or the compacted sheet past the deposition unit.

The system may further comprise an etching unit upstream of the deposition unit to etch the first surface side and the second surface side of the sheet, and/or to etch a first surface side and/or a second surface side of the compacted sheet, wherein the second surface side of the compacted sheet is opposite from the first surface side of the compacted sheet.

The system may further comprise a wire-drawing unit downstream of the wrapping unit to wire-draw the rod into a wire, in particular a wire having an elliptic cross section or a circular cross section.

The system may further comprise a slicing unit downstream of the compacting unit to slice the compacted sheet in a lengthwise direction into a plurality of elongated slices.

The above description describes the features of the method and system for forming a multilayer composite structure in isolation. However, in some examples some or all of these features may also be combined.

BRIEF DESCRIPTION OF THE FIGURES

The effects and numerous advantages of the present disclosure will become clearer from a detailed description of examples with reference to the accompanying drawings, in which:

FIG. 10 is a schematic drawing illustrating the effect of coating and grain coarsening according to an example;

FIG. 15 is a schematic illustration of a system for forming a multilayer composite structure according to another example;

FIG. 16 illustrates a wrapped coated sheet according to an example;

FIGS. 22a and 22b illustrate the functioning of a wire-drawing system according to an example;

DETAILED DESCRIPTION

Figure 1:
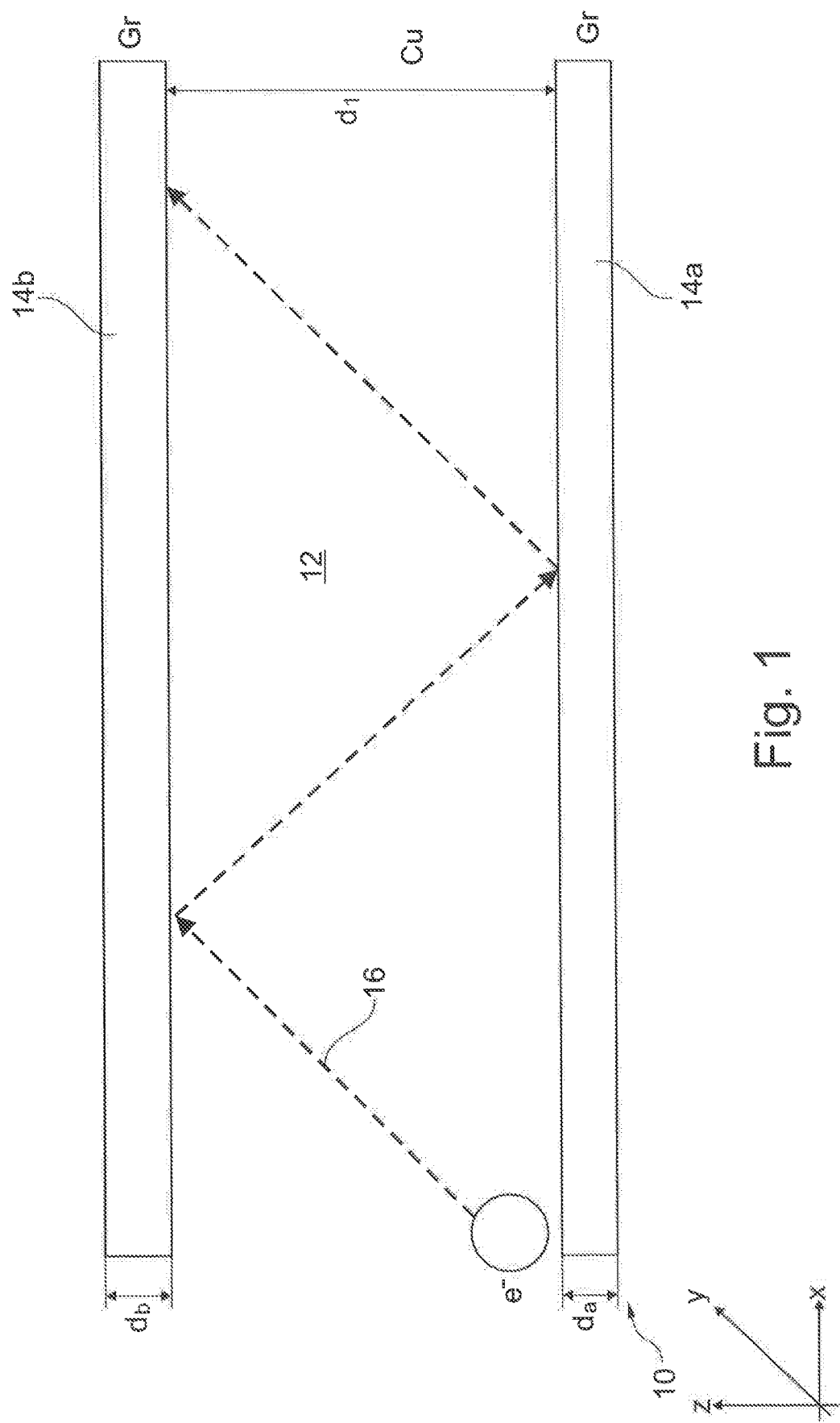
FIG. 1 is a schematic cross-section of a composite structure according to an example.

FIG. 1 is a schematic illustration of the composite structure 10 according to an example in a cross-sectional view. The composite structure 10 comprises a copper layer 12 sandwiched by a first (lower) graphene layer 14a and a second (upper) graphene layer 14b.

The copper layer 12 may be formed of pure copper (Cu), in particular in a (111) crystallographic orientation. However, in other examples, the copper layer comprises additional material other than copper, such as doped atoms or nanoparticles, as will be described in more detail below.

The copper layer 12 as shown in FIG. 1 extends at a width or thickness $d_1$ between the first graphene layer 14a and the second graphene layer 14b, wherein $d_1$ is generally no larger than 25 µm. For instance, the copper layer 12 may be formed at a thickness of 20 µm or 10 µm. In other examples, the copper layer 12 may be formed at a thickness of no larger than 2 µm or no larger than 1 µm.

The first graphene layer 14a and second graphene layer 14b are generally much thinner than the copper layer 12, and may in particular be graphene layers comprising a single graphene monolayer, or a plurality of graphene monolayers. In FIG. 1, the width or thickness of the graphene layers 14a and 14b is denoted by $d_a$ and $d_b$, respectively. For instance, $d_a$ and $d_b$ may both amount to 5 nm, 2 nm, or even less.

In a graphene monolayer configuration, the conduction band touches the valence band in single points, the so-called Dirac points. The infinitesimal small band gap explains the superior electric conductivity of graphene monolayer structures as opposed to graphite.

The first graphene layer 14a and the second graphene layer 14b may be chemically connected or bound to the copper layer 12, such as deposited on the copper layer 12 by means of chemical vapor deposition, as will be described in additional detail below.

The schematic illustration of FIG. 1, the width directions $d_1$, $d_a$, and $d_b$ define the z direction. The copper layer 12 and first and second graphene layers 14a, 14b may spatially extend widely in the planar spatial directions x, y perpendicular to the width direction z, so that the composite structure 10 forms a thin foil, as will be described in additional detail below.

Graphene coatings on copper are known to have remarkable in-plane stiffness to prevent mechanical deformation, such as surface distortions. Moreover, graphene coatings show impermeability to protect copper against reactive chemical or gaseous species, along with low density-of-states to avoid perturbation of the copper surface potential after coating. All of these superior physical properties make graphene an ideal non-interacting barrier for copper samples, prevent oxidation and surface contamination in general, and contribute to a composite structure with superior parameters.

FIG. 1 further illustrates schematically the path 16 of an electron e traveling through the copper layer 12. As can be taken from FIG. 1, the electron e is repeatedly scattered off the boundaries between the copper layer 12 and first graphene layer 14a and second graphene layer 14b, respectively. The graphene layers 14a, 14b protect the surface of the copper layer 12 to result in a largely smooth, pristine and wrinkle-free layer. In particular, graphene grown on Cu (111) surfaces is only weakly interacting with the Cu surface states. The relatively weak coupling between the carbon 2p orbitals of graphene and the Cu 4p orbitals leads to predominantly elastic surface scattering, which reduces the electric conductivity of the composite structure 10 in the planer direction x, y.

The graphene layers 14a, 14b in addition improve the thermal conductivity of the composite structure 10. In general, thermal device design is becoming an important part of electric and microprocessor engineering. The high thermal conductivity of the graphene layers 14a, 14b can provide a parallel phonon component for heat conduction.

In addition, the graphene layers 14a, 14b enhance the mechanical strength of the composite structure 10 in the planer direction x, y.

Figure 2:
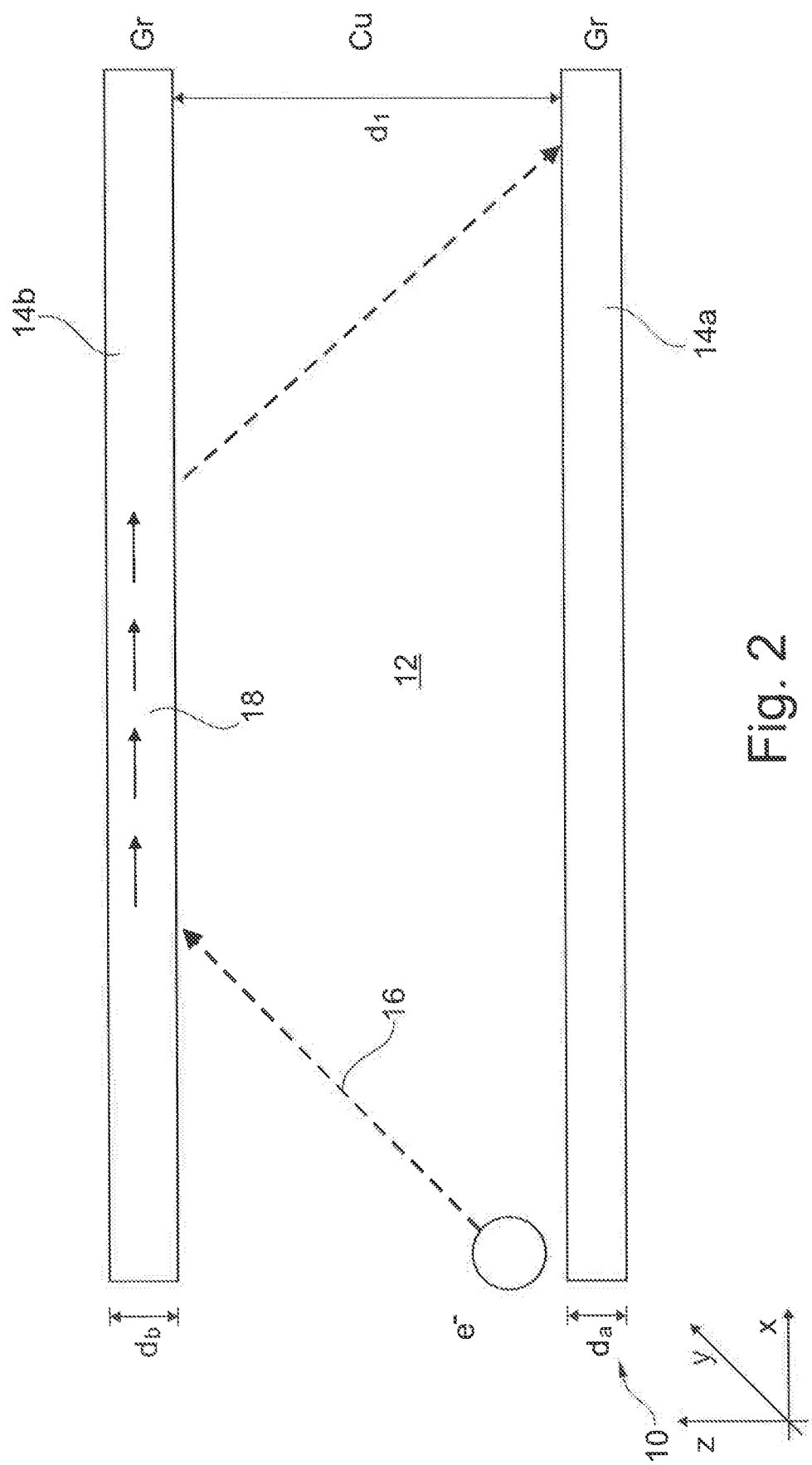
FIG. 2 is a schematic cross-section illustrating electron tunneling in a composite structure according to an example.

FIG. 2 is a schematic cross-sectional drawing of the composite structure 10 that generally corresponds to FIG. 1, but illustrates a tunneling mechanism in which electrons tunnel through part of the graphene layers 14a, 14b to result in even higher electric conductivity. A composite structure 10 with a thin copper layer 12, in particular a copper layer 12 whose width $d_1$ is in the range of only a few electron mean free path lengths in copper, presents a waveguide-like structure where electrons experience only a fraction of the bulk electrical resistance. This effect exploits the wave nature of the electrons in a quantum electrodynamic description. In particular, electrons traveling through the copper layer 12 may tunnel through electron tunnels 18 that form in the graphene layers 14a, 14b. Since the electrons travel through an ideal graphene monolayer 14a, 14b close to the speed of light while their speed in the copper layer 12 is much lower in general, and also limited due to various scattering effects, the electron wave approaching the copper/graphene interface appears to be back-scattered not at the location of the impact but further down in the flow direction (to the right in FIG. 2). As shown in the electron path 16 in FIG. 2, the electron is still back-scattered from the graphene layer 14b into the copper layer 12, but with a displacement corresponding to the distance it traveled (tunneled) through the graphene layer 14b. Because of the large difference in electron speed between copper and graphene in a quantum approach, an electron e travels a certain distance within the composite structure 10 much faster than in a classical particle approach. Given that a higher electron speed is generally equivalent to a better electrical conductivity, the possibility of electron tunneling in a composite structure 10 with a thin copper layer 12 sandwiched by graphene layers 14a, 14b leads to an enhanced electric conductivity.

The effect may be explained in additional detail in terms of the Klein effect: A peculiar property of the Dirac Hamiltonian is that charge carriers (like electrons) cannot be confined by electrostatic potentials. In conventional conductors, if an electron strikes an electrostatic barrier that has a potential height above the electron's kinetic energy, the electron wave function becomes evanescent within the barrier, and exponentially decays with increasing distance into the barrier. This means that the taller and wider the barrier is, the more the electron wave function will decay before reaching the other side. Thus, usually, the taller and wider the barrier is, the lower the probability of the electron quantum tunneling through the barrier.

However, if the particles are governed by the Dirac equation, their transmission probability actually increases with increasing barrier height. A Dirac electron that hits a tall barrier may turn into a hole and propagate through the barrier until it reaches the other side, where it may turn back into an electron. This phenomenon is sometimes called Klein tunneling.

One possible explanation for this phenomenon is that increasing barrier height may lead to an increased degree of mode matching between the wave functions of the holes within the barrier and the electrons outside of it. When the modes are perfectly matched (which may correspond to the case of an infinitely tall barrier), there may be perfect transmission through the barrier.

Applying these considerations to the composite structure 10 as shown in FIG. 2, the graphene layers 14a, 14b may be thin enough to appear electrically invisible, allowing an electron to "see" through the graphene the copper layer on the other side of the tunnel. As soon as the electron is inside the electron tunnel 18, it experiences the much higher conductivity and speeds up in the direction of the main current flow.

Figure 3:
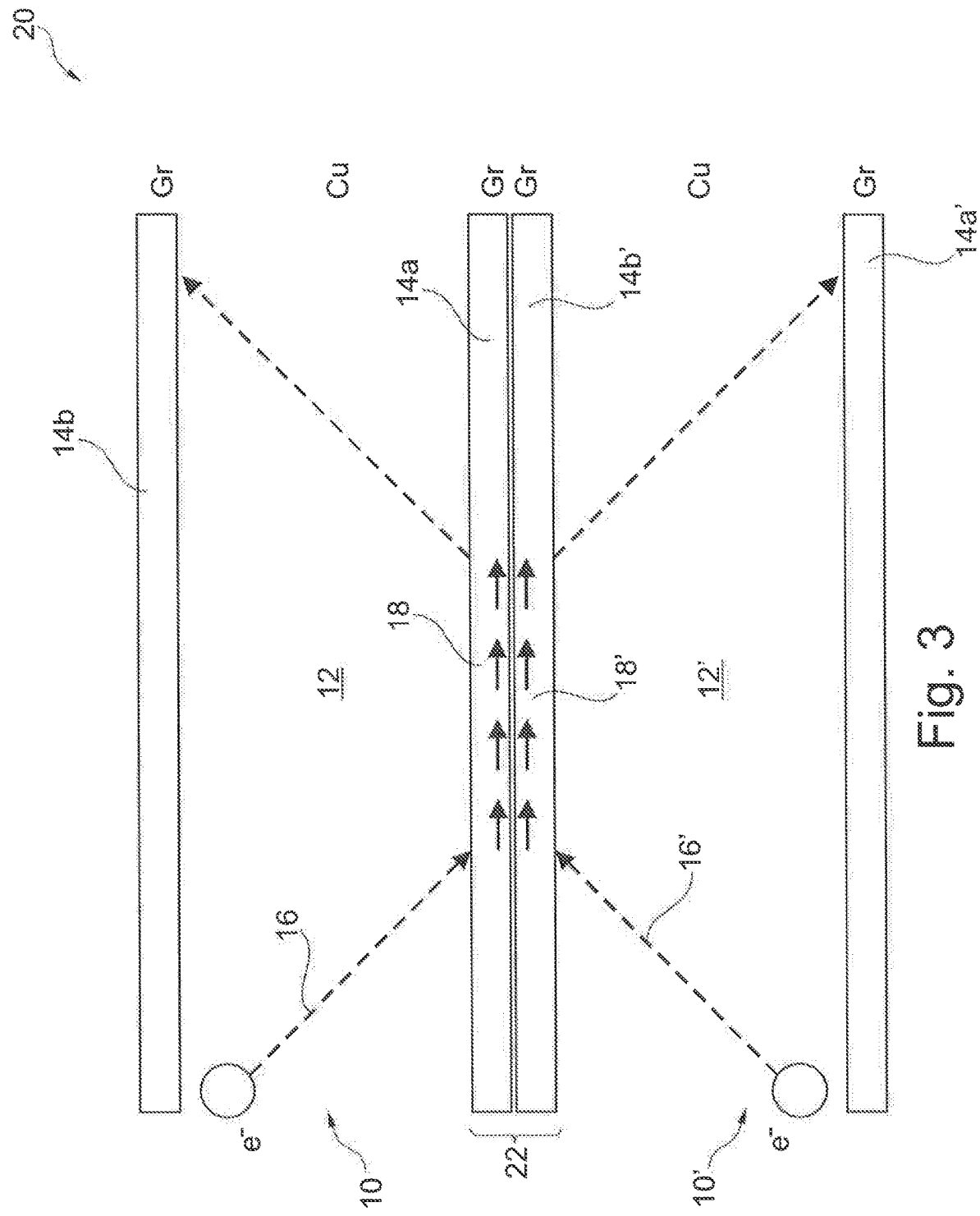
FIG. 3 is a cross-sectional schematic illustration of a composite bi-layer structure according to an example.

As illustrated in the conceptual cross-sectional diagram of FIG. 3, several composite structures 10 as described above with reference to FIGS. 1 and 2 may be stacked to form a multilayer composite structure 20. In the stacked multilayer composite structure 20, a first graphene layer 14a of a first composite structure 10 is positioned on and in direct contact with the second graphene layer 14b' of another composite structure 10'.

FIG. 3 shows a multilayer composite structure 20 with two elementary composite structures 10, 10', but in general a large number of composite structures may be stacked in the same way.

As can be taken from FIG. 3, the multilayer composite structure 20 comprises a graphene bi-layer 22 formed of a pair of graphene layers 14a, 14b' of neighboring composite structures 10, 10'.

The graphene bi-layer 22 takes particular advantage of the Klein effect as described above, since it allows electrons to tunnel back and forth between copper layers 12 of neighboring composite structures 10 through the electron tunnels 18, 18' formed in the graphene layers 14a, 14b'. Figuratively speaking, the adjacent graphene layers 14a, 14b' of the graphene bi-layer 22 form a high-speed tunnel path through the multilayer composite structure 20, which results in a superior electric conductivity.

The effect may be particularly pronounced in multilayer composite structures 20 with only exactly two adjacent graphene layers 14a, 14b'. With three or more layers, at least one graphene layer would not be directly connected to copper.

The composite structure 10 and multilayer composite structure 20 as described with reference to FIGS. 1 to 3 above may be employed to form electrical cables or wires with enhanced electrical conductivity.

Figure 4:
FIG. 4 is a flow diagram illustrating a method for forming a composite structure according to an example.

FIG. 4 is a schematic flow diagram illustrating a method for forming a composite structure.

In a first step S10, a copper foil having a first surface side and a second surface side opposite the first surface side is provided, wherein the copper foil has a thickness of no larger than 25 µm.

In a second step S12, a first graphene layer is deposited on the first surface side of the copper foil, and a second graphene layer is deposited on the second surface side of the copper foil.

Figure 5:
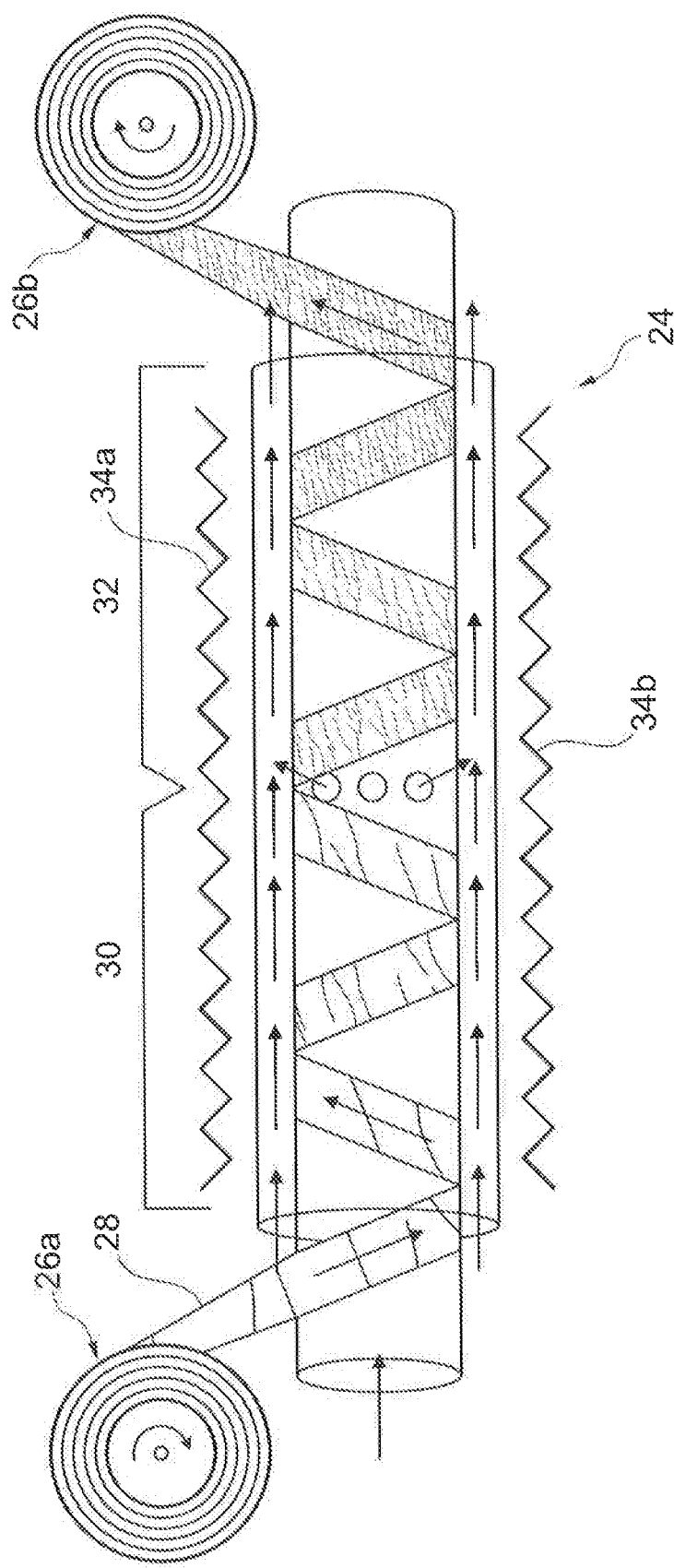
FIG. 5 is a schematic illustration of a system for forming a composite structure according to an example.

A plurality of coating techniques may be employed to deposit the first graphene layer and the second graphene layer on the copper foil. For instance, the depositing may comprise chemical vapor deposition techniques. A chemical vapor deposition (CVD) apparatus 24 is schematically illustrated in FIG. 5. A corresponding apparatus is described in greater detail by Polson, McNerney, Viswanath, et al. in Nature Scientific Reports, May 2015, 10.1038/srep 10257.

The CVD apparatus 24 as shown in FIG. 5 comprises a transport unit with a plurality of transport rolls 26a, 26b to transport a thin copper foil 28 subsequently through an annealing zone 30 and a growth zone 32 downstream of the annealing zone 30.

In the annealing zone 30, the copper foil 28 may be heated to temperatures in the range between 500° C. and 1000° C. in the presence of a pure argon gas flow (indicated by arrows in FIG. 5). By keeping the copper foil 28 for 20 to 30 minutes at elevated temperatures, the copper foil 28 is annealed, resulting in a considerable surface smoothening. Moreover, grain growth can be initiated.

Chemical vapor deposition takes place in the growth zone 32, where carbon atoms supplied by a precursor gas such as methane are deposited as the surface of the copper foil 28. The flow of the precursor gas is likewise illustrated by arrows in FIG. 5. Heating wires 34a, 34b are arranged along the length of the annealing zone 30 and growth zone 34 to provide the annealing temperature and break up the molecules of the precursor gas.

Graphene synthesis under atmospheric CVD conditions may be performed in the growth zone 32 at temperatures between 500° C. and 1000° C. using a gas mixture of argon and methane. Monolayer graphene growth up to 96% of the total area could be observed when a methane gas concentration varying between 0.2% and 1% by volume was employed. Higher methane concentrations may lead to the formation of multi-layer graphene structures.

It was also observed that the formation of the graphene monolayer on the copper foil 28 at elevated temperatures led to the preferred formation of a (111) crystallographic structure on the copper surface. In some instances, the graphene layer may act as a sort of template to the copper surface of the copper foil 28, which promotes the formation of a (111) crystallographic copper structure because of the close lattice size match between copper and graphene in this configuration.

The CVD apparatus 24 as illustrated in FIG. 5 may be employed to deposit a graphene layer on a single surface side of the copper foil 28. In order to deposit graphene layers 14a, 14b on both sides of the copper foil 28 to arrive at a composite structure 10 as described with reference to FIGS. 1 and 2, one may pass the copper foil 28 through the CVD apparatus 24 twice, with opposite surface orientations of the copper foil 28.

Figure 6:
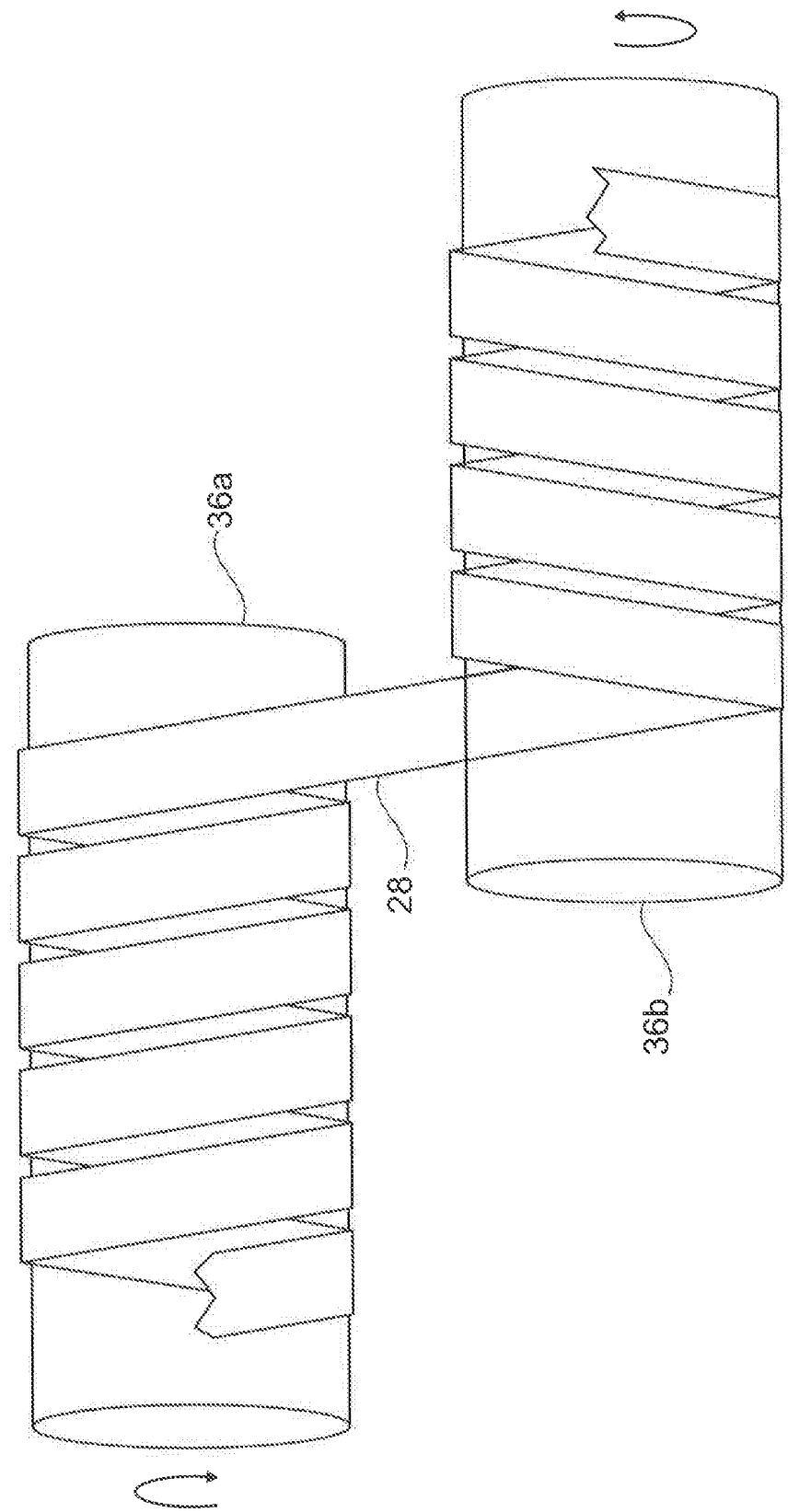
FIG. 6 is a schematic illustration of a transport unit with counter-rotating rollers according to an example.

The surface orientation may be changed by means of a transport unit comprising a pair of counter-rotating transport rolls 36a, 36b as shown in FIG. 6. For instance, a first transport roll 36a may rotate in a first (clockwise) direction and may pass the copper foil 28 to a second transport roll 36b rotating in an opposite (counter-clockwise) direction to change the orientation of the copper foil 28.

Optionally, the copper foil 28 may be etched before being fed into the CVD apparatus 24 to remove surface contaminants, such as by exposing the samples at 450° C. for 90 minutes to a hydrogen (70 vol.-%) and argon (30 vol.-%) gas flow.

Figure 7:
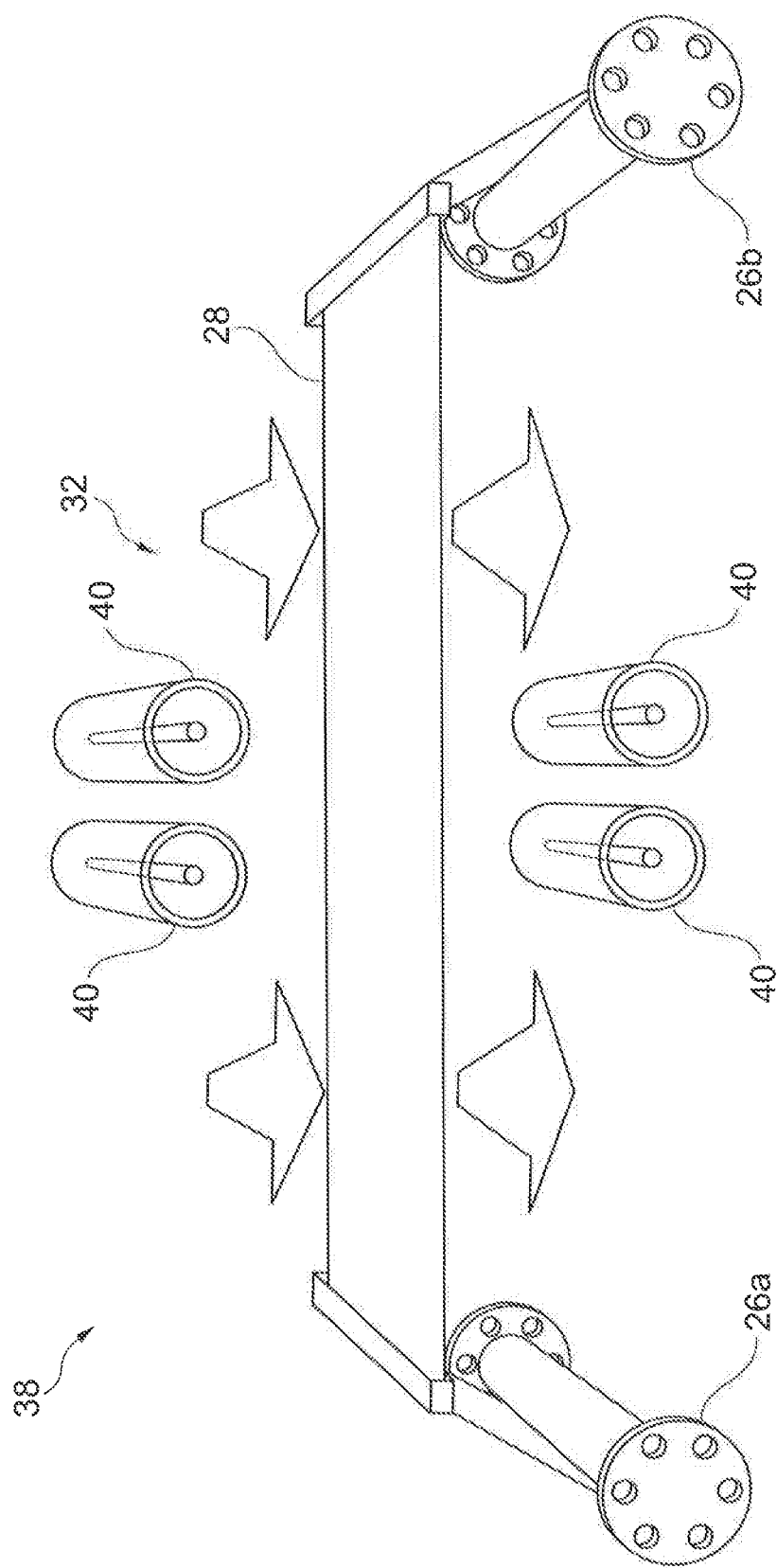
FIG. 7 is a schematic illustration of a system for forming a composite structure employing plasma tubes according to an example.

FIG. 7 is a schematic illustration of a chemical vapor deposition (CVD) apparatus according to another example that may be employed for forming the composite structures of the present disclosure. The CVD apparatus 38 illustrated in FIG. 7 is generally similar to the CVD apparatus 24 described above with reference to FIG. 5, but employs cold plasma-enhanced chemical vapor deposition rather than electrical heating by means of heating wires 34a, 34b.

In greater detail, the cold plasma CVD apparatus 38 comprises a transport unit with transport rolls 26a, 26b to transport a thin copper foil 28 through a growth zone 32. A supply unit (not shown in the schematic illustration of FIG.

7) directs a precursor gas comprising carbon into the growth zone 32 so that the precursor gas passes and circulates around the copper foil 28 on both of its opposing surface sides, as indicated by the arrows in FIG. 7. For instance, the precursor gas may comprise methane and/or butane and/or propane.

As can be further taken from FIG. 7, a plurality of plasma units 40 comprising plasma tubes are provided in the growth zone 32 on both sides of the copper foil 28 to generate a cold plasma discharge that breaks up the molecules of the precursor gas and allows the carbon atoms to coat both surface sides of the copper foil to form the first and second graphene layers 14a, 14b. As can be taken from FIG. 7 and the above description, the cold plasma CVD apparatus 38 allows for the graphene layers 14a, 14b to be deposited on both surface sides of the copper foil 28 simultaneously, thereby enhancing the process efficiency and reducing cycle times.

Preceding etching and/or annealing may take place in the same way as described above with reference to FIG. 5.

Figure 8:
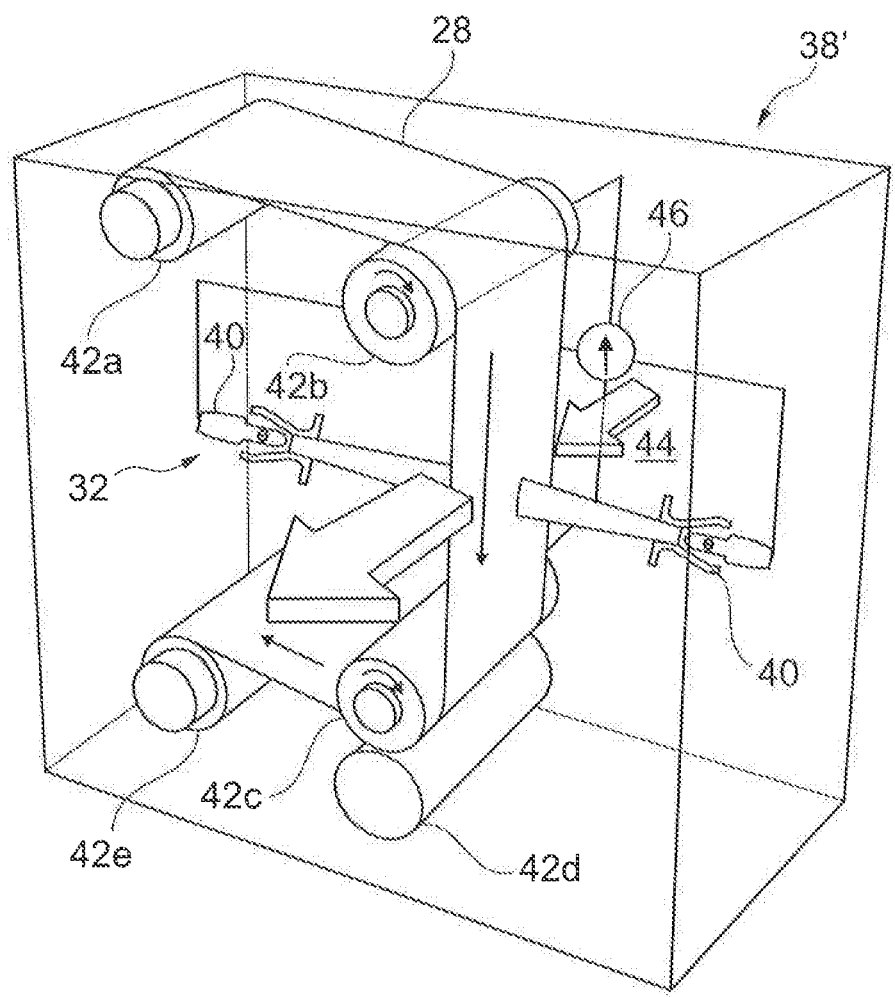
FIG. 8 is a schematic illustration of a system for forming a composite structure according to an example.

A cold plasma CVD apparatus 38' according to another example is schematically illustrated in the perspective view of FIG. 8.

As can be taken from FIG. 8, the cold plasma CVD apparatus 38' comprises a transport unit with a plurality of transport rolls 42a to 42e that transport a copper foil 28 through a growth zone 32, similarly to the configuration of FIG. 7. A supply unit 44 supplies a precursor gas such as methane and directs it through the growth zone 32 so that it passes and circulates around the copper foil 28 on both surface sides, as indicated by the arrows in FIG. 8. A deposition unit comprising a plurality of plasma units 40 with plasma tubes provides a cold plasma discharge to break up the molecules of the precursor gas so that the carbon is deposited on both surface sides of the copper foil as first and second graphene layers 14a, 14b.

However, unlike the configuration of FIG. 7 in which the copper foil 28 is transported horizontally through the growth zone 32, in the configuration of FIG. 8 the transport rolls 42a to 42e transport the copper foil 28 through the growth zone 32 in a vertical direction, i.e. in a direction that corresponds to the direction of the gravitational field in which the CVD apparatus 38' is placed. This allows to coat both surface sides of the copper foil 28 more uniformly.

Preceding etching and/or annealing may take place in the same way as described above with reference to FIG. 5.

As can be further taken from FIG. 8, the cold plasma CVD apparatus 38' additionally comprises a charging unit 46 electrically connected to the transport rolls 42b, 42c to electrically charge the copper foil 28. Moreover, the charging unit 46 is electrically coupled to the plasma units 40 to charge the precursor gas with a charge opposite from the charge of the copper foil 28. The electrostatic charging of the copper foil 28 facilitates the growth of the graphene layers 14a, 14b on the copper foil 28, and may lead to graphene layers 14a, 14b that are more homogeneous and uniform.

In contrast to more conventional graphene growth in a furnace that reaches temperatures between 900 and 1000° C., the cold plasma coating technology enables graphene deposition at a much lower temperature, which may be in the range of approximately 650° C. The reduced temperature leads to reduced thermal stress of the copper surface, and prevents damage and crystallographic reconfiguration of the surface of the copper foil that could be detrimental to an efficient graphene coating.

At the same time, the temperatures reached in the cold plasma coating technology are sufficiently high to provide for a controlled and thorough grain coarsening of the copper layer 12 of the composite structure 10. It may be advantageous to start with a copper layer 12 that already has a majority (111) grain orientation, which may subsequently transform into complete (111) coarse grain orientation after graphene deposition, supported by the good lattice match between the Cu atomic spacing and the graphene lattice constant.

Figure 9:
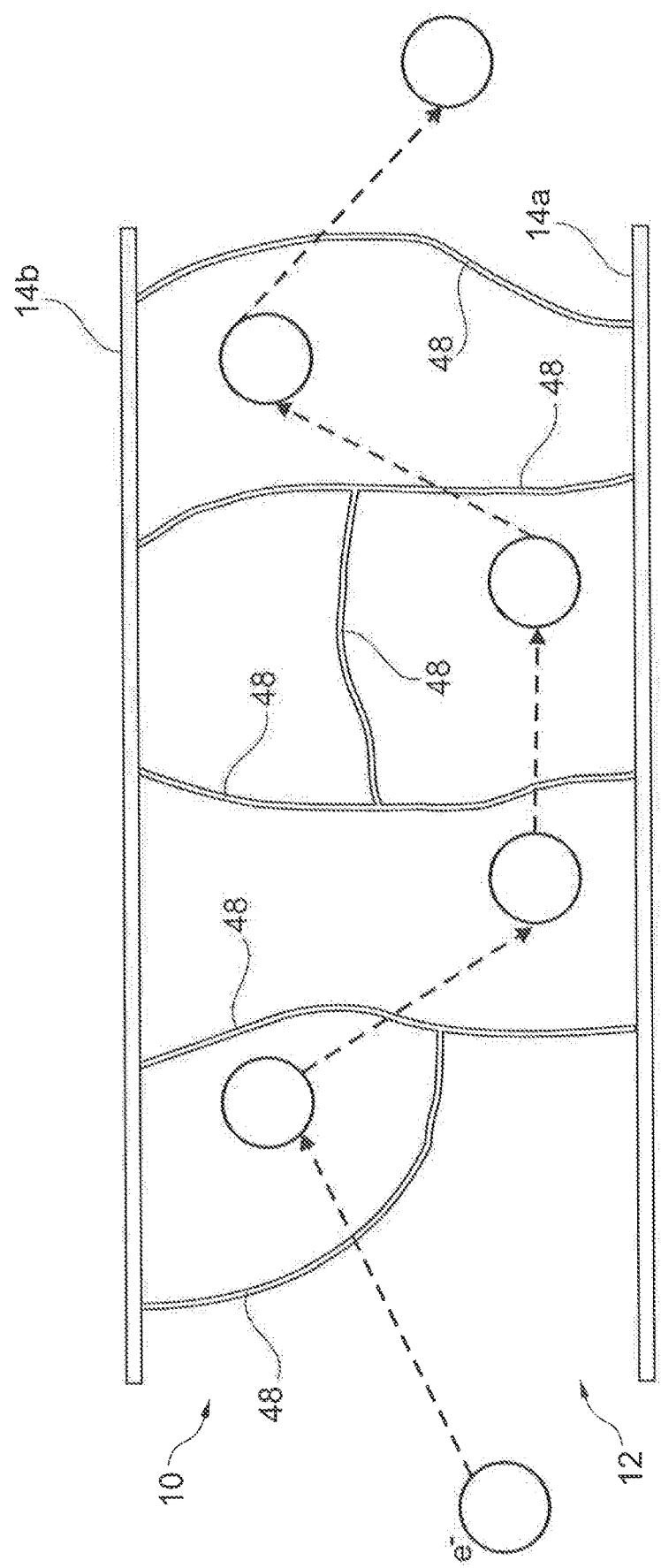
FIG. 9 is a schematic cross-sectional illustration to illustrate the effect of grain boundary scattering in a composite structure according to an example.

FIG. 9 is a schematic illustration of a composite structure 10 that generally correspond to the composite structure illustrated in FIGS. 1 and 2 above, but in addition depicts the grain boundaries 48 that may exist in the copper layer 12 and may lead to inelastic electron scattering that can hamper the electric conductivity of the composite structure 10. The thermal energy supplied in the course of the cold plasma coating process may lead to a grain coarsening, i.e. to a larger grain size of at least 10 μm or greater, as illustrated schematically in FIG. 10. The larger grain size may entail a reduction of inelastic scattering of electrons inside the copper layer 12, and may hence contribute to a higher electric conductivity.

The relatively low bonding strength between individual layers of the composite structure 10 or multilayer composite structure 20 may be enhanced by chemically functionalizing graphene, such as by hexa-hepta functionalization. In particular, plasmonic metal particles, such as silver nanoparticles, may be added to the graphene layers 14a, 14b without changing the hexagonal lattice properties. Instead of adding molecules to the individual carbon atoms of graphene (covalent functionalization), hexa-hepta functionalization or ring-centered functionalization adds metal atoms, such as silver nanoparticles to the center of the graphene ring. The bond is delocalized inside the graphene ring, which keeps the hexagonal arrangement undistorted, so that graphene retains its unique electrical properties. At the same time, the metal atoms may serve as anchoring points for thermally connecting the graphene layers 14a, 14b to the underlying copper layer 12.

Figure 11B:
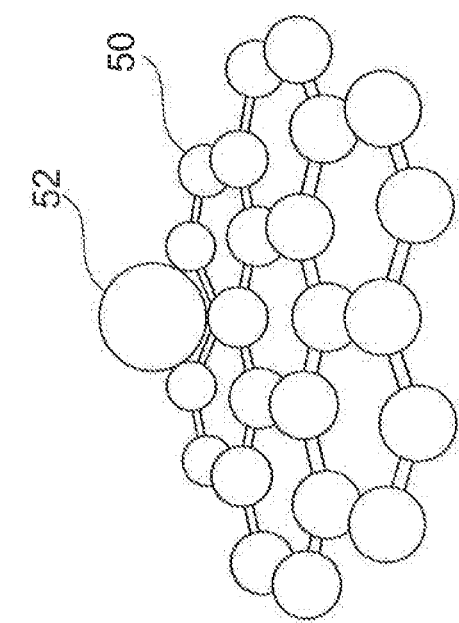
FIGS. 11a and 11b illustrate a hexa-hepta functionalization of graphene layers with metal atoms according to an example.
Figure 11A:
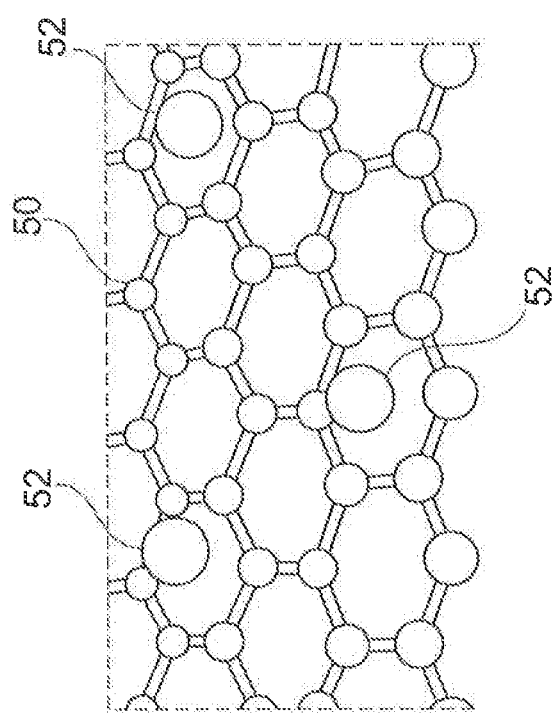

FIGS. 11a and 11b are a plane view and a perspective view, respectively of a graphene monolayer 50 with the characteristic hexagonal carbon rings and show the doped ring-centered silver nanoparticles 52 delocalized inside the carbon rings.

The hexa-hepta functionalization can be performed after CVD growing a graphene monolayer on a pristine copper (111) surface as described above. It may consist of a two-step process; a synthesis of $\eta^6$-graphene Cr(Co)$_3$ followed by silver nanoparticles attachment. Corresponding techniques have been described by S. Che et al. in "Retained Carrier-Mobility and Enhanced Plasmonic-Photovoltaics of Graphene via Ring-Centered Functionalization and Nano-Interfacing", Nano Letters, Jun. 6, 2017.

Forming Multilayer Composite Structures

The manufacturing techniques described above provide a composite structure 10 with a single copper layer 12 sandwiched by first and second graphene layers 14a, 14b, as illustrated in FIGS. 1 and 2. In order to provide the multilayer composite structures 20 as illustrated in FIG. 3 with their enhanced electrical conductivity, the coated copper foil 28 may be stacked.

In an example, the coated copper foil 28 may be cut into pieces or stripes, and several of these pieces may be stacked under pressure and heat.

In an example, pressing may involve sintering, such as hot sintering, microwave sintering or field-assisted sintering involving alternating current or direct current.

For instance, sintering temperatures may be in the range between 500° C. and 1000° C. By a suitable choice of the sintering temperature and sintering duration, the copper grain size may be further enhanced. Moreover, sintering allows the copper layers to better adapt to the graphene crystal structure, and hence fosters the formation of a crystallographic (111) surface structure in the copper of the copper foil 28.

The stacking may be performed in a combined sintering and pressing apparatus under mechanical pressures in the range of 10 MPa to 300 MPa.

In an alternative configuration that will now be described in additional detail with reference to FIGS. 12 to 18, a multilayer composite structure 20 may be provided by wrapping and compacting the coated copper foil 28.

Figure 12:
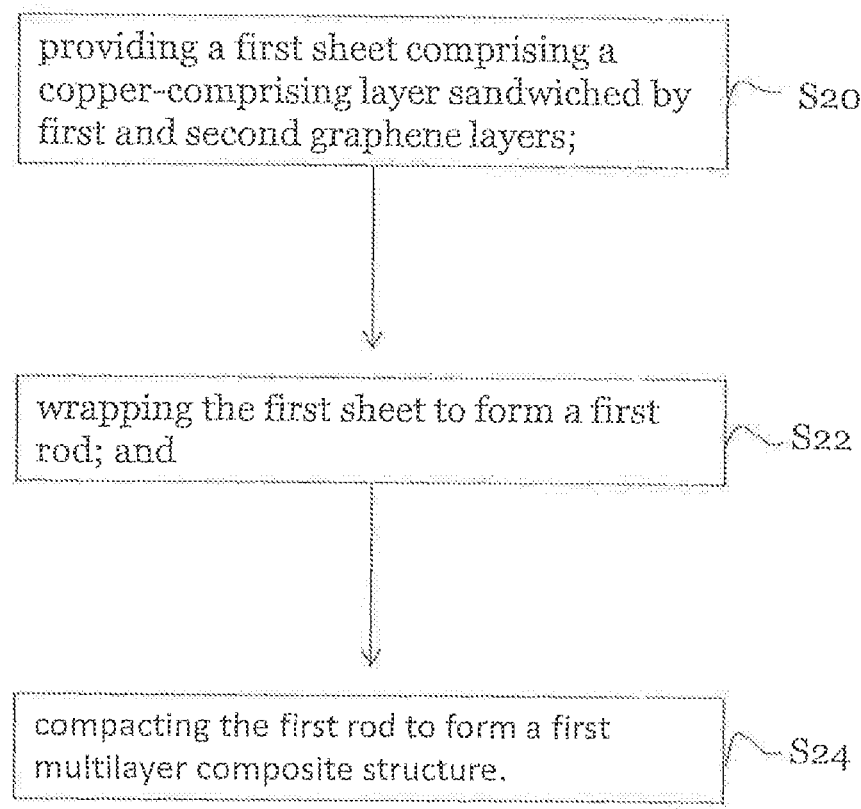
FIG. 12 is a flow diagram illustrating a method for forming a multilayer composite structure according to an example.

FIG. 12 is a flow diagram illustrating a method for forming a multilayer composite structure 20 comprising a stack of composite structures 10 according to an example.

In a first step S20, a first sheet comprising a copper-comprising layer sandwiched by first and second graphene layers is provided, such as the coated copper foil 28.

In a second step S22, the first sheet is wrapped to form a first rod.

In a third step S24, the first rod is compacted to form a first multilayer composite structure.

The sequence of steps as illustrated in FIG. 12 may be repeated several times. In particular, the multilayer composite structure resulting from step S24 may again be coated on both sides by back feeding the resulting multilayer foil into the cold plasma CVD apparatus 38, 38' as described above with reference to FIGS. 7 and 8, respectively, followed by a second round or several additional rounds of wrapping and compacting.

Figure 13:
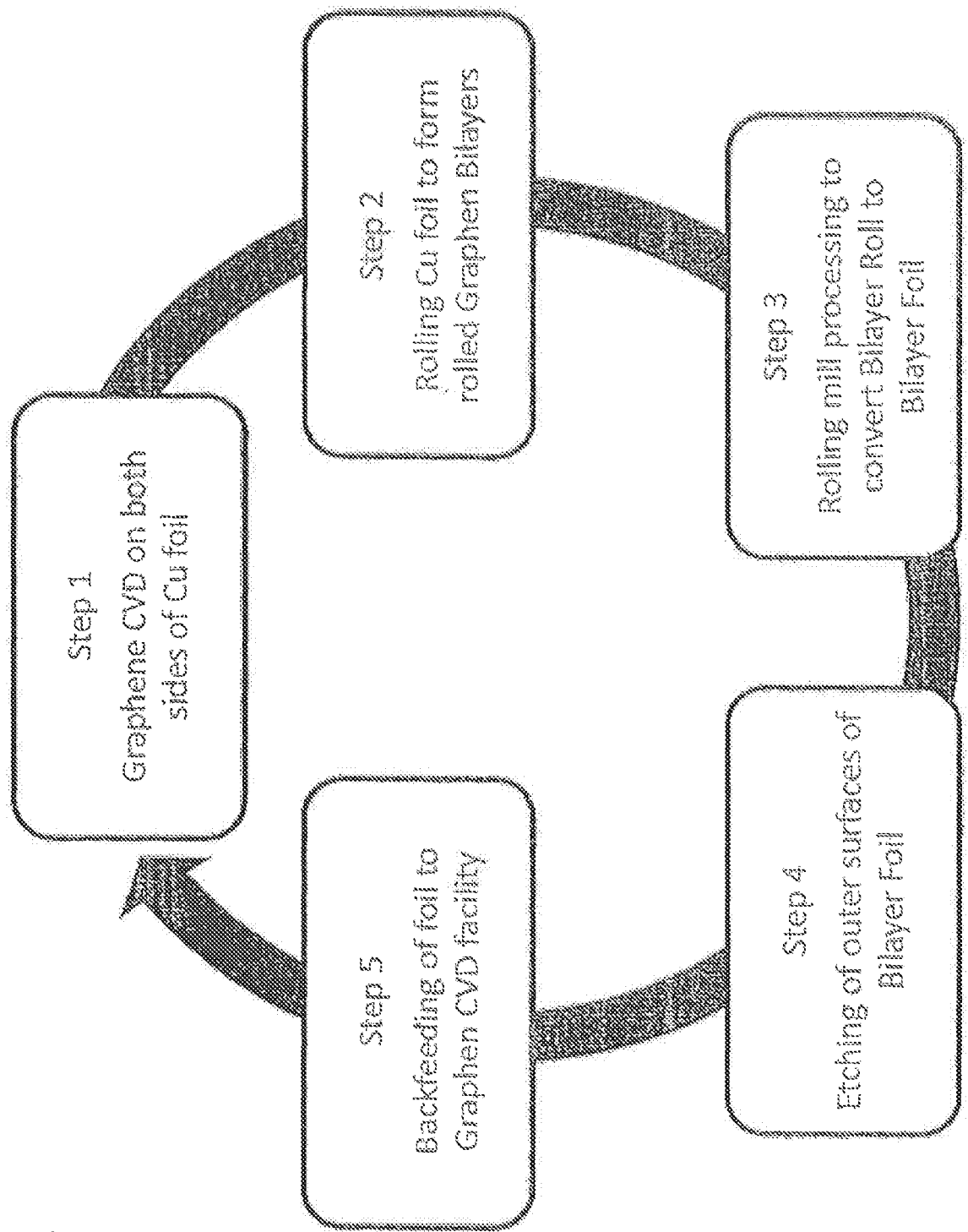
FIG. 13 is a cycle diagram illustrating a method for forming a multilayer composite structure according to an example.

An exemplary process cycle is illustrated in FIG. 13.

In step 1, graphene layers are deposited by means of chemical vapor deposition on both sides of a copper-comprising foil, such as by employing a cold plasma CVD apparatus 38, 38'.

In a subsequent step 2, the resulting foil is rolled or wrapped to form rolled graphene bi-layers.

In a subsequent step 3, the resulting rod is roll-milled to convert the bi-layer roll to a bi-layer foil.

In a subsequent (optional) step 4, the outer surfaces of the bi-layer foil may be etched to provide a pristine copper surface, before the foil is back fed into the graphene CVD facility in step 5.

The process cycle can be described by the following sequence of steps:
0. A counter is set to zero.
1. A graphene monolayer is grown on both sides of a copper-comprising foil in a CVD coating facility.
2. The coated foil is then wrapped around so that a tube or rod is created with a circular concentric structure of alternating copper and bi-layer graphene layers.
3. The rod is then compacted, such as by metal hot rolling pressing, creating a flat copper/graphene multilayer composite band containing a multitude of graphene bi-layers 22.
4. The resulting composite band is then etched on both surfaces to provide a pristine copper surface.
5. The counter is now increased by 1. If the counter is smaller than a pre-defined threshold, the process proceeds with step 1 by back-feeding the resulting structure into the CVD coating facility.
6. If the counter reaches the threshold value, the copper/graphene composite band is extracted from the coating and rolling cycle.

The process circle as described above may be called "CWH-Circle" (coating, wrapping, hot-rolling). The process circle may result in a multilayer composite structure in which the volume fraction of graphene is significantly enhanced compared to the single-layer composite structure 10 of FIG. 1. In particular, the process circle allows to vary the volume fraction of graphene in the matrix by selecting the number of circle iterations. This may allow to increase and/or tailor the electrical conductivity, the thermal conductivity, and/or the mechanical strength of the copper/graphene composite material to a desired value.

Figure 14:
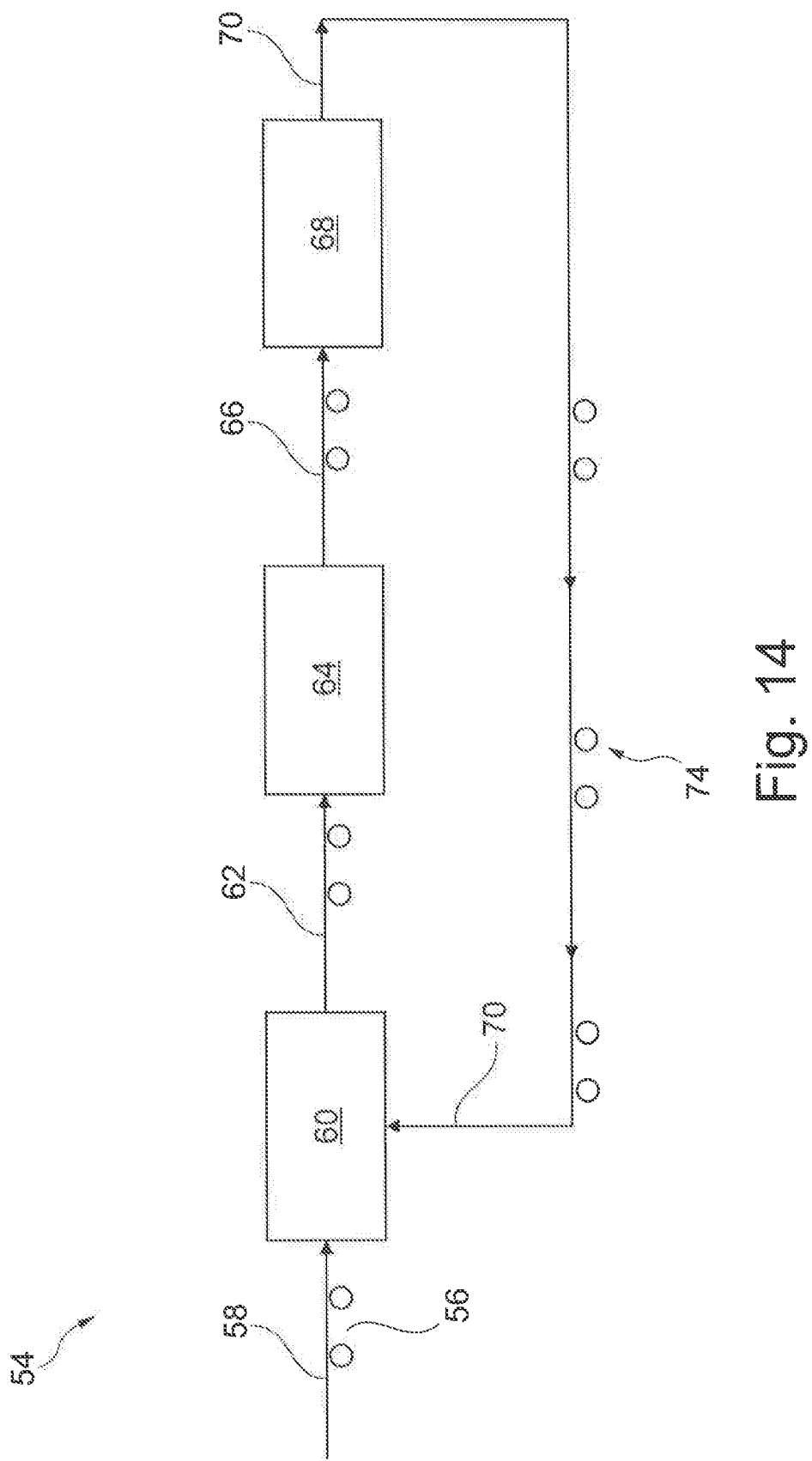
FIG. 14 is a schematic illustration of a system for forming a multilayer composite structure according to an example.

FIG. 14 is a schematic illustration of a system 54 for forming a multilayer composite structure employing the techniques described above.

The system 54 comprises a transport unit 56, such as a plurality of driven transport rolls, to transport a sheet 58, such as the copper foil 28, to a deposition unit 60.

The deposition unit 60 may comprise a cold plasma CVD apparatus 38, 38' as described with reference to FIGS. 7 and 8 above, and may deposit pairs of graphene layers 14*a*, 14*b* on opposing first and second surface sides of the sheet 58, resulting in a coated sheet 62 with a composite structure 10 as described above with reference to FIGS. 1 and 2.

In an example, the deposition unit 60 may comprise an annealing unit, providing an annealing zone 30 upstream of the deposition growth zone as described above with reference to FIG. 5.

The transport unit 56 transports the coated sheet 62 from the deposition unit 60 to a wrapping unit 64 to wrap the coated sheet 62 into a rod 66. The wrapping unit 64 may employ any technique to wrap the coated sheet, such as rolling up the coated sheet on a thin cylindrical roll, and removing the roll.

The resulting rod 66 is illustrated schematically in FIG. 16. As can be taken from FIG. 16, due to the wrapping or rolling, the rod 66 comprises graphene bi-layer structures in which two graphene layers 14*a*, 14*b* are in immediate and direct contact, as described above with reference to FIG. 3, and therefore has all the conductivity advantages described above.

With further reference to FIG. 14, the transport unit 56 may transport the rod 66 to a compacting unit 68 downstream of the wrapping unit 64. The compacting unit 68 may compact the rod 66 into a compacted sheet 70.

Figure 17A:
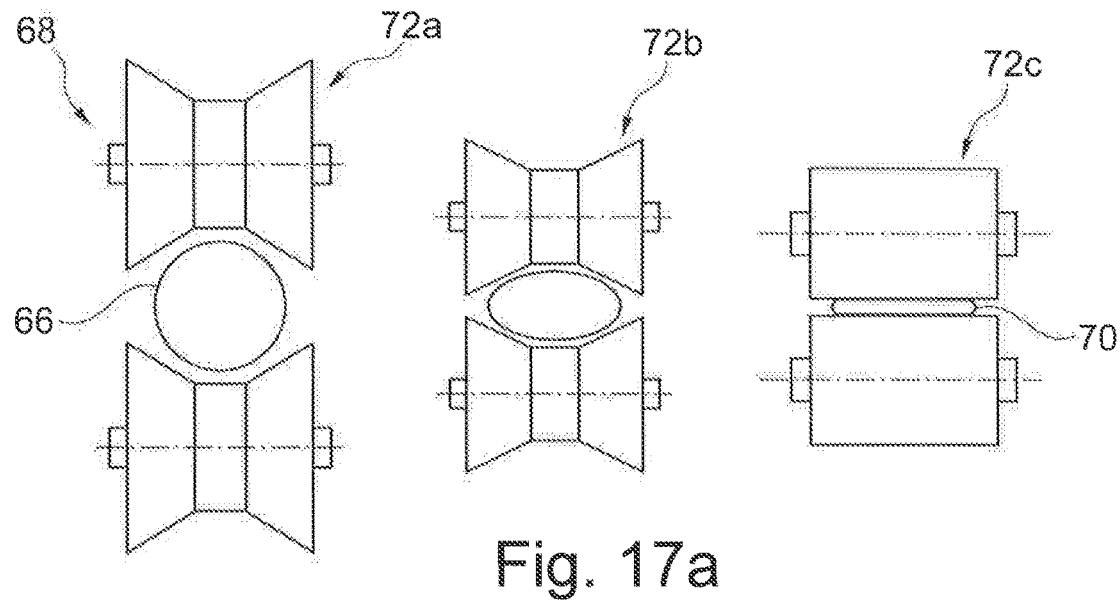
FIGS. 17a and 17b schematically illustrate a compacting unit according to an example.
Figure 17B:
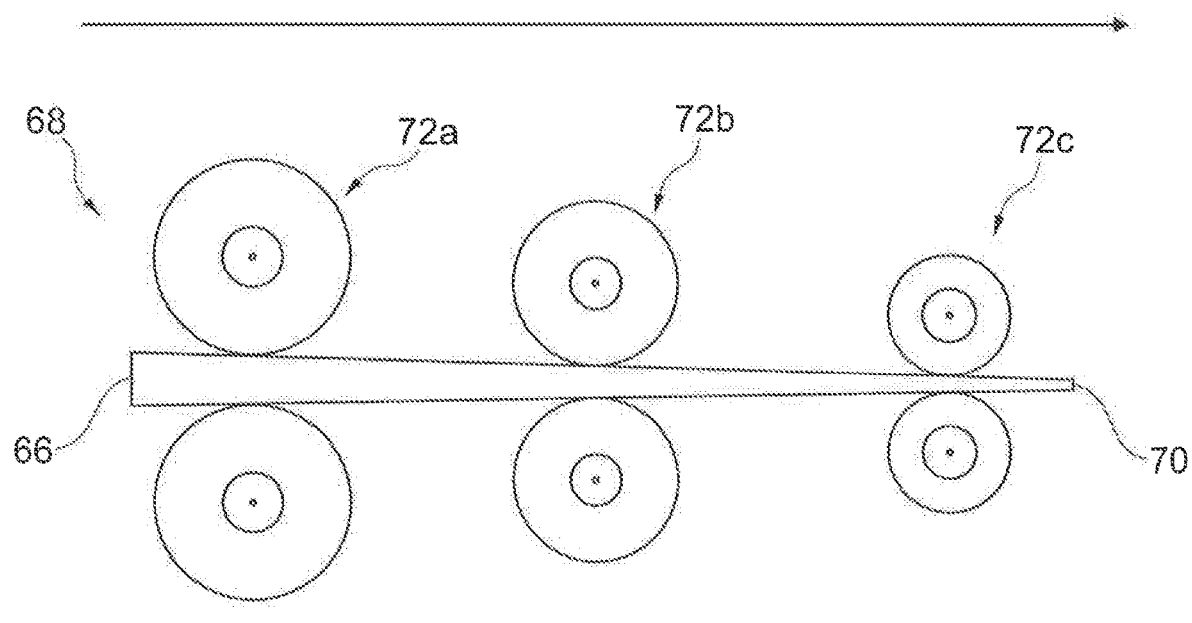

For instance, the compacting unit 68 may be a rolling press, in particular a hot rolling press, as illustrated schematically in a front view in FIG. 17*a* and in a side view in FIG. 17*b*.

As can be taken from FIGS. 17*a* and 17*b*, the hot rolling press 68 may comprise a plurality of press units 72*a*, 72*b*, 72*c* in a staggered configuration, so that the rod 66 passes subsequently through the press units 72*a*, 72*c* in a transport direction (illustrated by the central arrow in FIGS. 17*a* and 17*b*) and is thereby converted into the compacted sheet 70, such as a thin long band.

FIGS. 17*a* and 17*b* show a compacting unit 68 with three staggered press units 72*a*, 72*b*, 72*c*. However, this is for illustration only, and in other configurations the compacting unit 68 may comprise a smaller or larger number of press units.

The compacting unit 68 may further comprise a heating unit (not shown) to heat the rod 66 during the compacting. Hot rolling may provide two advantageous effects: On the one hand, it further increases the copper grain size, which leads to a reduction of the grain scattering and hence to superior electric conductivity, as described above with reference to FIGS. 9 and 10. On the other hand, hot rolling may foster the copper (111) crystallographic orientation, which may increase the lattice match between the copper surface and the grown-on graphene layers, thereby providing a multilayer composite structure with enhanced mechanical properties.

For grain growth to happen effectively, the processing temperature should be sufficiently higher than the copper re-crystallization temperature of approximately 227° C. However, in order to avoid any nano-cracks of the copper surface, in some examples the hot rolling temperature should be chosen below 650° C. In particular, the hot rolling temperature may be chosen between 450° C. and 550° C.

Figure 18C:
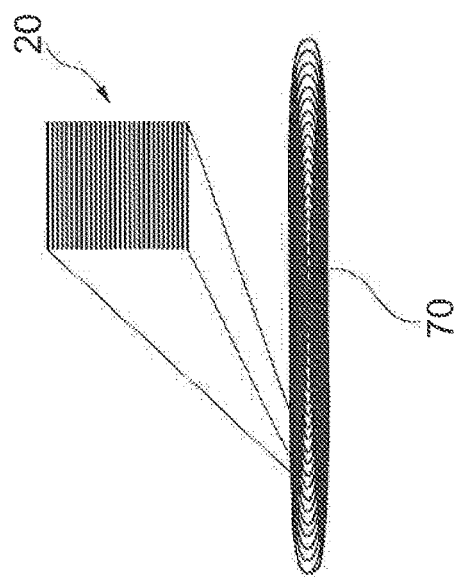
FIGS. 18a to 18c schematically illustrate the effect of compacting a wrapped coated sheet according to an example.
Figure 18B:
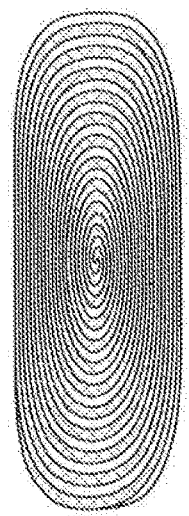
Figure 18A:
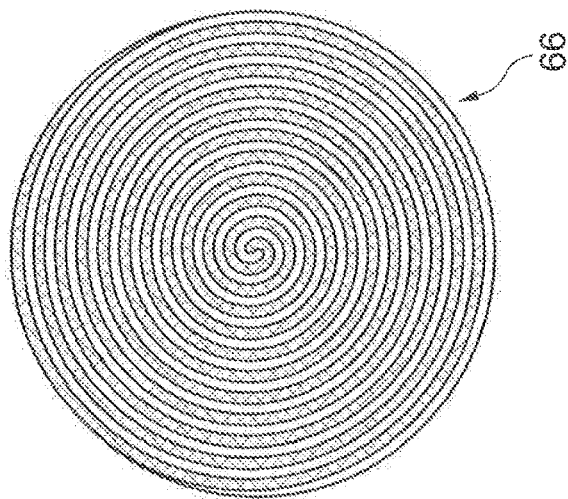

The sequence of FIGS. 18a to 18c show the rod 66 in a cross-sectional schematic view and its transformation into the compacted sheet 70 as it progresses through the press units 72a, 72b, 72c of the compacting unit 68.

The techniques described above take advantage of the fact that graphene layers are sort of "slippery", and generally do not stick to each other well. The reason behind this effect is that graphene has strong covalent bonding between its atoms in the horizontal direction (in-plane with the monolayers) but only relatively weak van der Waals forces in a direction vertical to the in-plane direction, which keeps it from mechanically attaching vertically to the next layer. On the other hand, because of the excellent match between the graphene lattice constant and the Cu (111) atomic spacing, the graphene layer is strongly mechanically bonded to the copper surface on which it is grown.

Due to these reasons, graphene/copper layers can slide relatively easily with respect to each other, making the above-described conversion from a round shape of the rod 66 to a flat band 70 possible without sacrificing the excellent mechanical connection between the individual graphene layers 14a, 14b and the copper layers 12 on which they are grown. At the same time, the copper surfaces are protected by the mechanically extremely robust graphene coating, keeping any mechanical stress away from the copper during the severe plastic deformation. As illustrated in the insert of FIG. 18c, the result is a multilayer composite structure 20 corresponding to a stacking of the composite structure 10 as described above with reference to FIG. 3.

As can be further taken from FIGS. 18b and 18c, the plurality graphene layers in the compacted sheet 70 are still interconnected with one another, which is due to the fact that the compacted sheet 70 results from compactification of the rod 66 having a single wrapped graphene layer. The connection fosters the electric conductivity in a direction perpendicular to the in-plane direction.

With further reference to FIG. 14, the system 54 additionally comprises a back-feeding unit 74 which may comprise transfer rollers to back feed the compacted sheet 70 to the deposition unit 60 for another round of chemical vapor deposition, wrapping, and compacting, as described above with reference to the circle diagram of FIG. 13.

FIG. 15 is a schematic illustration of a system 54' for forming a multilayer composite structure according to another example. The system 54' is similar in design and functionality to the system 54 described with reference to FIG. 14 above, and the same reference numerals are employed to denote corresponding components. However, the system 54' comprises one or a plurality of optional units, which are illustrated in broken lines in FIG. 15.

In particular, the system 54 may comprise an etching unit 76 upstream of the deposition unit 60. The etching unit 76 may be employed to etch a first surface side and/or a second surface side of the sheet 58 and/or the back-fed compacted sheet 70 by means of chemical etching, so as to provide a pristine copper surface for a subsequent deposition in the deposition unit 60.

For instance, the etching unit 76 may comprise a quartz tube furnace, which may expose the sheet 58 to a hydrogen (70 vol.-%) and argon (30 vol.-%) gas flow at temperatures in the range of 450° C. for approximately 90 minutes. This allows to efficiently remove surface contaminants from the surfaces of the sheet 58.

As can be further taken from FIG. 15, the system 54 may alternatively or additionally comprise a bypass unit 78 configured to bypass the sheet 58 or compacted sheet 70 past the deposition unit 60.

In particular, after the circle process has reached the desired number of iterations, the resulting multilayer compacted sheet 70 may be fed back to the circle by means of the back-feeding unit 74 one last time, but skipping the graphene coating step. In particular, the bypass unit 78 may pass the compacted sheet to the wrapping unit 64 so that it does not traverse the deposition unit 60. This may ensure that in the final wrapped rod 66 produced by the wrapping unit 64, the single layers are not separated by graphene layers. In particular, this may facilitate layer fusing in a subsequent wire drawing technique in a wire-drawing system 80, as will be described in additional detail with reference to FIGS. 19 to 24 below. Wire drawing in a wire-drawing system 80 may be a final step to convert the rod 66 into a wire 82 with enhanced electrical, thermal and mechanical properties.

Alternatively, as further illustrated in FIG. 15, the system 54 may comprise a slicing unit 84 downstream of the compacting unit 68 and adapted to slice the compacted sheet 70 in a longitudinal direction into a plurality of elongated slices 86 in a final process step, after the maximum number of iterations has been reached. This may provide wires with a rectangular or square cross-section.

Wire-Drawing Method and System

As described above with reference to FIG. 15, wire drawing techniques may be employed to convert a multilayer composite rod 66 comprising the multilayer composite structure 20 into a wire.

Figure 19:
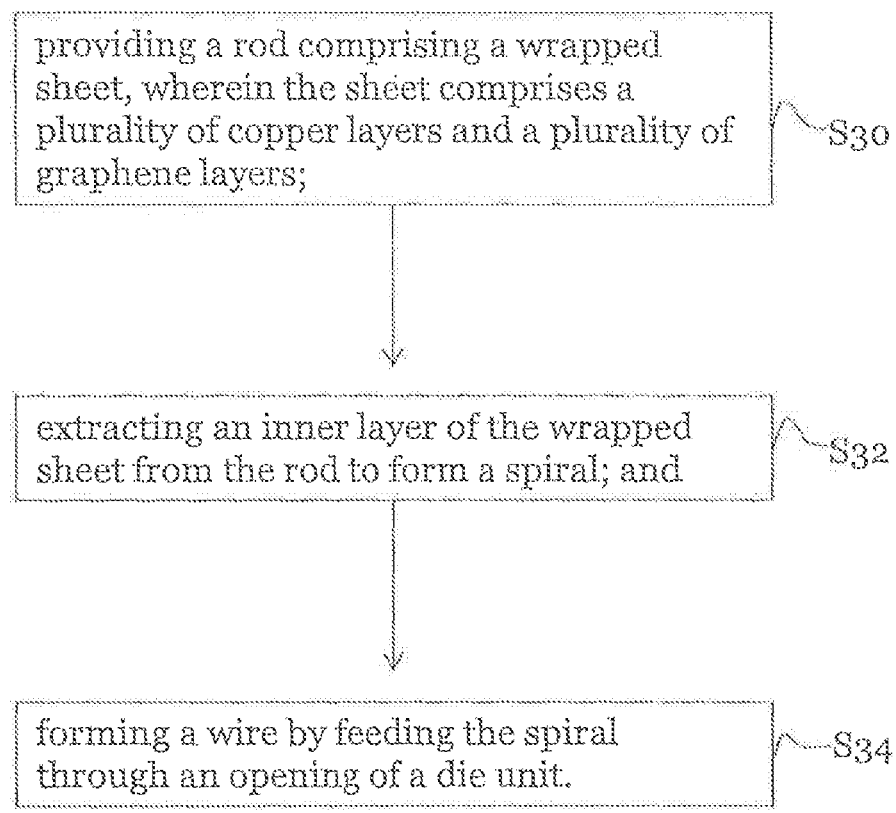
FIG. 19 is a flow diagram illustrating a wire-drawing method according to an example.

FIG. 19 is a flow diagram illustrating a wire-drawing method according to an example.

In a first step S30, a rod comprising a wrapped sheet is provided, wherein the sheet comprises a plurality of copper layers and a plurality of graphene layers.

In a second step S32, an inner layer of the wrapped sheet is extracted from the rod to form a spiral or helix.

In a third step S34, a wire is formed by feeding the spiral through an opening of a die unit.

Figure 20:
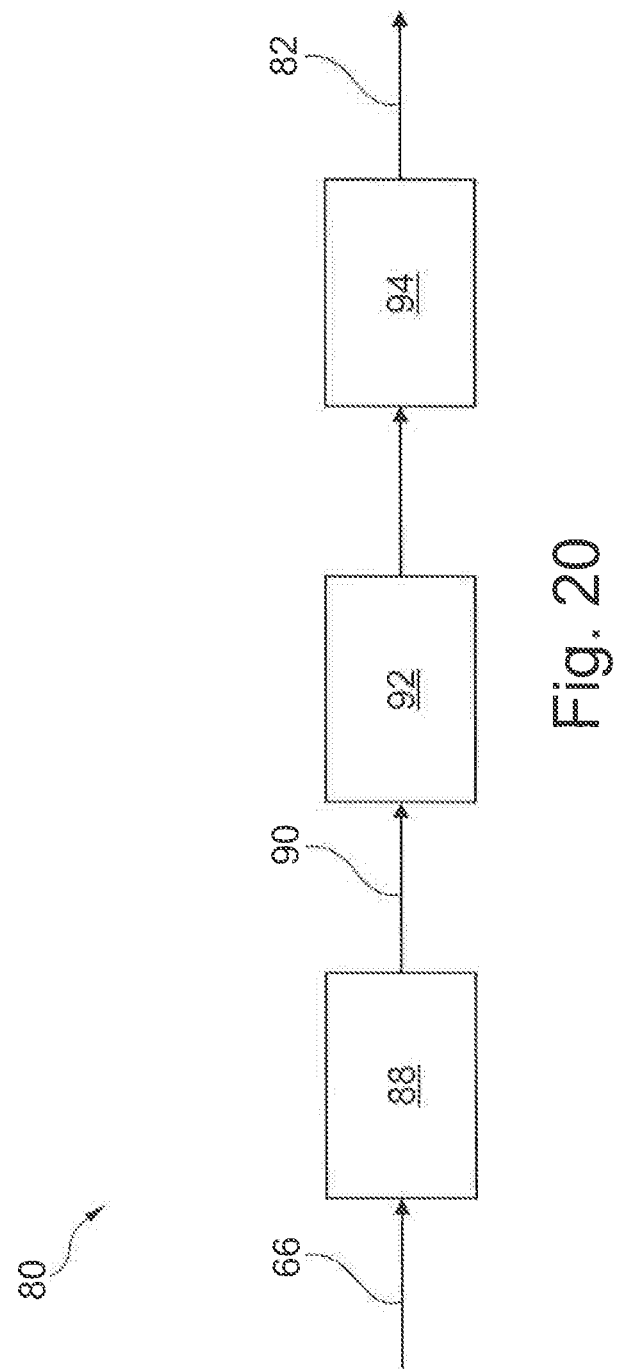
FIG. 20 is a schematic illustration of a wire-drawing system according to an example.
Figure 21:
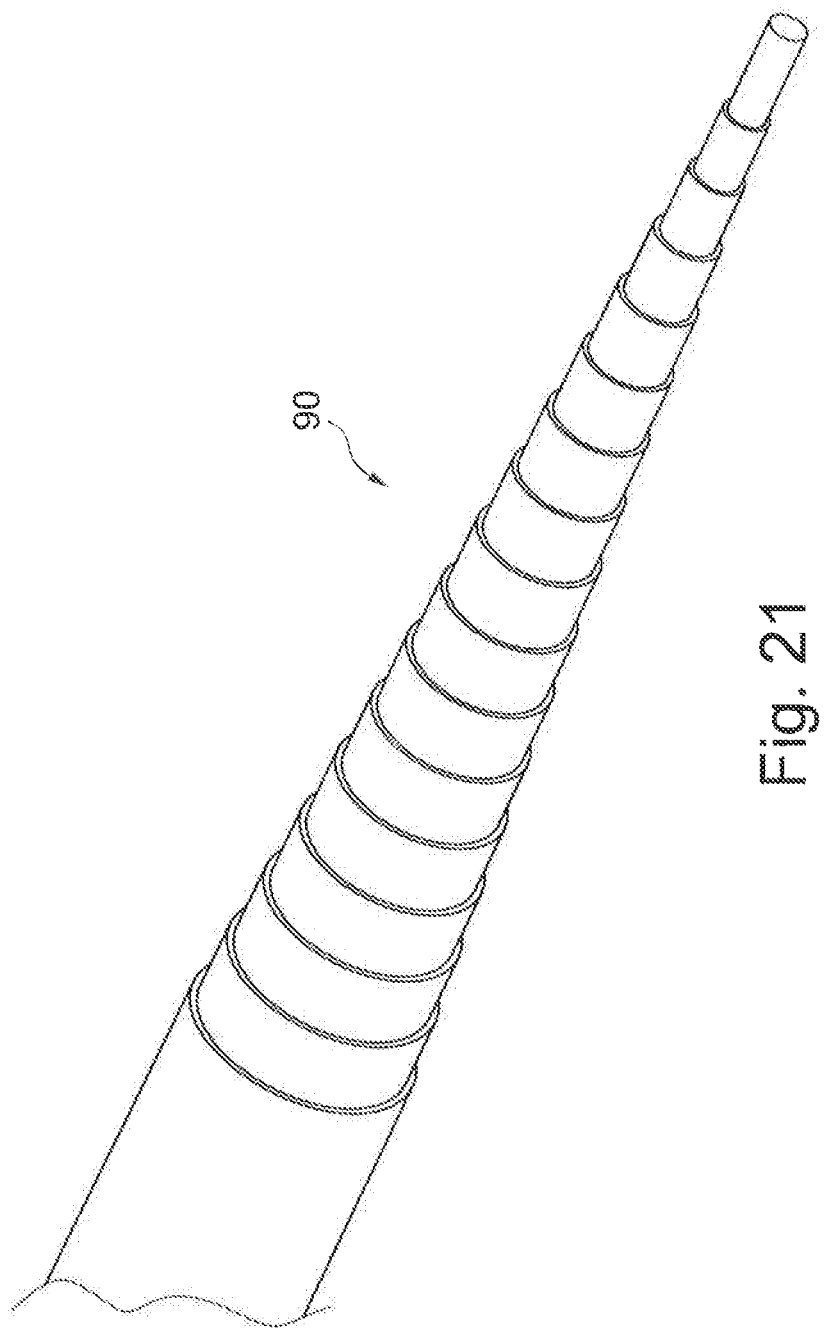
FIG. 21 is a perspective schematic illustration of a composite wrap extracted to form a band spiral according to an example.

FIG. 20 is a schematic illustration of a corresponding wire-drawing system 80 that may be configured to perform the steps of the method illustrated in the flow diagram of FIG. 19.

The wire-drawing system 80 comprises an extracting unit 88 adapted to extract an inner layer of a wrapped sheet to form a spiral, wherein the sheet comprises a plurality of copper layers and a plurality of graphene layers.

In particular, the wrapped sheet may be the rod 66 comprising the multilayer composite structure as described above with reference to FIG. 18a. The extracting unit 88 may be adapted to extract an innermost layer of the rod 66, such as by grabbing the innermost layer of the rod 66 and pulling it to form a helix or spiral 90 as illustrated in the perspective drawing of FIG. 21. In the spiral 90, each individual graphene bi-layer 22 is connected on both sides directly to the copper substrate where they are grown, so that the enhanced conductivity occurs in a largely increased volume fraction of the wire, providing for both ultra-high conductivity and high current capacity.

As described above with reference to FIG. 15, it may be beneficial that the windings of the spiral 90 do not have graphene-coating on the outside, since this might prevent them from fusing together homogeneously. In addition, a graphene-free surface provides optimum conditions for connecting the resulting wire 82 to sockets or plugs, such as by means of soldering, clamping, crimping, etc.

With additional reference to FIG. 20, the wire-drawing system 80 further comprises a feeding unit 92 downstream of the extracting unit 88, and adapted to feed the spiral 90 to a die unit 94, which converts the spiral 90 into a wire 82.

In some examples, the feeding unit 92 may comprise a pushing unit configured to push the spiral 90 towards and through the die unit 94.

In some examples, the extracting unit and the feeding unit are separate units.

In other examples, the feeding unit may be part of the extracting unit. For instance, in a configuration in which the feeding units comprises a pushing unit to push the spiral towards and through the die unit 94, the pushing may extract an inner layer of the wrapped sheet as a result of the pushing force.

FIG. 22a is a schematic side view of a die unit 94 as it may be used in the wire-drawing system 80. The die unit 94 comprises a plurality of dies 96a, 96b, 96c in a staggered configuration. Each of the dies 96a, 96b, 96c comprises a respective opening 98a, 98b, 98c, wherein a diameter or surface area of the openings 98a, 98b, 98c decreases in a transport direction (to the right in FIG. 22a) of the spiral 90 as it passes through the die unit 94. The openings 98a, 98b, 98c may be openings with a circular or elliptic cross-section, depending on the desired cross-section of the wire 82. The openings 98a, 98b, 98c may have a diameter smaller than a diameter of the rod 66 or spiral 90, but larger than the wrapped innermost layer and thereby subsequently deform the rod 66 and spiral 90 into a wire under the pulling and/or pushing force.

FIG. 22a further illustrates a pulling unit 100 comprising a plurality of pulling rolls 102a, 102b that pull the spiral 90 through the openings 98a, 98b, 98c of the die unit 94. The pulling unit 100 may form part of the feeding unit 92, or may be a separate component.

As can be further taken from FIG. 22b, the pulling rolls 102a, 102b may be configured to rotate or orbit around the drawn wire with a pre-selectable spacing in between to create a wire 82 with a desired outer diameter and shape.

The configuration of FIGS. 22a and 22b shows a die unit 94 with three dies 96a, 96b, 96c with openings of decreasing diameter in the transport direction of the spiral 90. However, in general, the die unit 94 may comprise any number of dies in a staggered configuration.

The wire-drawing techniques according to the disclosure may also be employed for additional conductivity tuning of the composite multilayer structures, as will now be described with reference to FIGS. 23 and 24.

Stacked graphene, in which at least two graphene monolayers 104a, 104b are stacked with a twist angle $\Theta$ between them, may exhibit unique electronic, thermal, and magnetic properties. A rotational twist of the graphene monolayers 104a, 104b with respect to one another can have a profound effect on the electrical properties of the bi-layer structure. Controlling the twist angle $\Theta$ of bi-layer graphene films hence allows for the preparation of twisted bi-layer graphene films with defined stacking orientations, and in turn the tailoring and fine-tuning of their electronic, thermal, and magnetic properties.

Figure 23A:
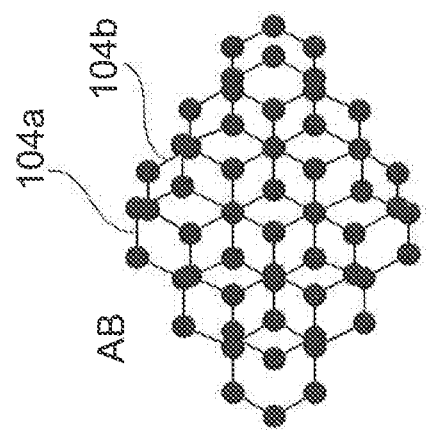
FIGS. 23a to 23c illustrate different stacking modes in bi-layer graphene structures according to an example.
Figure 23B:
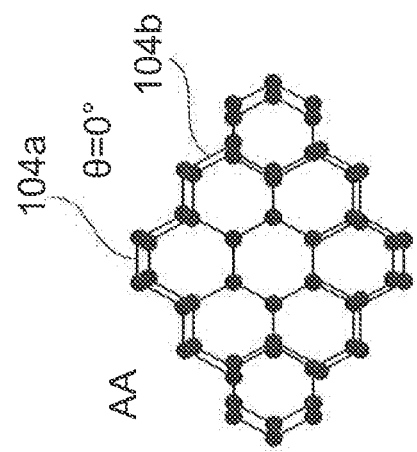
Figure 23C:
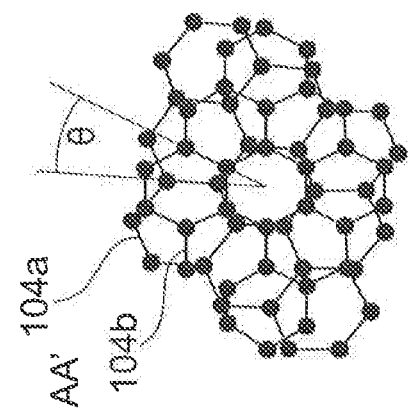

FIGS. 23a to 23c illustrate three different basic stacking modes in bi-layer graphene:

AB-stacking (also called Bernal stacking) is illustrated in FIG. 23a. The second graphene layer 104b is displaced by one half of the diameter of the hexagonal ring structure with respect to the hexagons of the first graphene layer 104a. This results in a parallel shift without a twist.

FIG. 23b schematically illustrates the so-called AA-stacking (also called non-Bernal stacking), in which the hexagons of the two layers 104a, 104b right on top of each other (no shift, no twist).

FIG. 23c illustrates AA'-stacking, which is similar to AA-stacking, but in which the crystallographic axes of the two layers 104a, 104b are twisted by an angle $\Theta$ between 0° and 60° with respect to one another (no shift, twist angle $\Theta$).

Figure 24B:
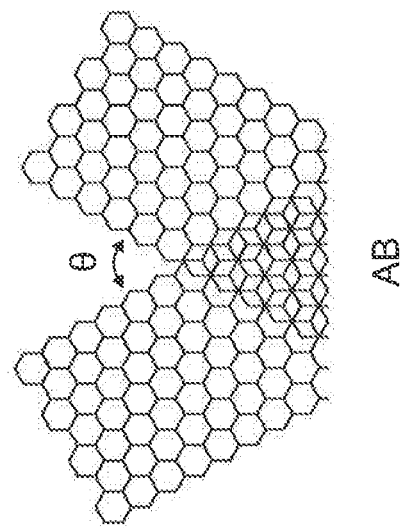
FIGS. 24a and 24b illustrate the transformation between different stacking modes of bi-layer graphene structures according to an example.
Figure 24A:
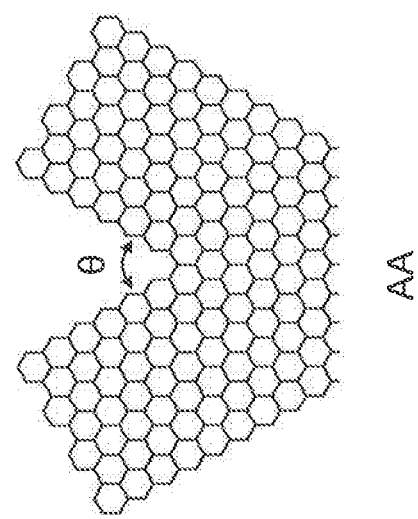

By means of twisting the layers by an angle of $\Theta=60°$, an AB configuration can be transformed into an AA configuration and vice-versa, as illustrated in FIGS. 24a and 24b.

In order to control the electrical, thermal, and magnetic properties of a stacked copper graphene bi-layer composite material, and in particular the wire 82, the twist angle $\Theta$ between the layers 104a, 104b may be adjusted by means of a die unit 94 in which the openings 98a, 98b, 98c have a non-zero inclination angle with respect to a feeding direction of the spiral 90.

As illustrated in FIG. 22a, a main twist angle $\Theta$ may be determined by means of the inclination angle of the openings 98a, 98b, 98c of the die unit 94. Different openings 98a, 98b, 98c may have different inclination angles with respect to a feeding direction of the spiral 90, which may lead to modifications and fine-tuning of the twist angle between the individual layers of the spiral 90.

The description of the embodiments and the Figures merely serve to illustrate the techniques of the disclosure, but should not be understood to imply any limitation. The scope is to be determined on the basis of the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for forming a multilayer composite structure, comprising:
   providing a first sheet comprising a copper-comprising layer sandwiched by first and second graphene layers;
   wrapping the first sheet to form a first rod;
   compacting the first rod using rolling, such that the first rod is flattened into a thin foil, thus forming a first multilayer composite structure;
   forming a second sheet, wherein forming the second sheet comprises:
      depositing a third graphene layer on a first surface side of the first multilayer composite structure, and
      depositing a fourth graphene layer on a second surface side of the first multilayer composite structure, wherein the second surface side is opposite from the first surface side;
   wrapping the second sheet to form a second rod; and
   compacting the second rod to form a second multilayer composite structure.

2. The method according to claim 1, wherein compacting the first rod comprises forming a first elongated multilayer composite band.

3. The method according to claim 1, wherein at least one of the first graphene layer and the second graphene layer has a thickness of no larger than 5 nm.

4. The method according to claim 1, wherein at least one of the first graphene layer and the second graphene layer has a thickness of no larger than 2 nm.

5. The method according to claim 1, wherein providing the first sheet comprises depositing the first graphene layer on a first surface side of the copper-comprising layer, and depositing the second graphene layer on a second surface side of the copper-comprising layer, the second surface side opposite from the first surface side.

6. The method according to claim 5, wherein depositing the first graphene layer is accomplished by chemical vapor deposition.

7. The method according to claim 1, further comprising:
   etching at least one of a first surface side of the first multilayer composite structure and a second surface side of the first multilayer composite structure;
   wherein the second surface side is opposite from the first surface side.

8. The method according to claim 1, wherein each of the third graphene layer and the fourth graphene layer has a thickness of no larger than 5 nm.

9. The method according to claim 1, wherein each of the third graphene layer and the fourth graphene layer has a thickness of no larger than 2 nm.

10. The method according to claim 1, wherein the compacting the second rod comprises rolling.

11. The method according to claim 10, wherein the rolling is hot rolling.

12. The method according to claim 1, further comprising:
   wrapping the second multilayer structure to form a third rod.

13. The method according to claim 12, further comprising:
   wire-drawing the third rod into a wire, wherein the wire has one of an elliptic cross section and a circular cross section.

14. The method according to claim 12, further comprising:
   compacting the third rod to form a third multilayer composite structure.

15. The method according to claim 14, further comprising:
   slicing the third multilayer composite structure to form a plurality of elongated slices.

16. The method according to claim 1, wherein the compacting the first rod comprises hot rolling.

* * * * *